United States Patent [19]
Yamaji

[11] Patent Number: 5,767,750
[45] Date of Patent: Jun. 16, 1998

[54] MODULATOR

[75] Inventor: Takafumi Yamaji, Ichikawa, Japan

[73] Assignee: Kabushiki Kaisha Toshiba, Kanagawa-ken, Japan

[21] Appl. No.: 379,708

[22] Filed: Jan. 27, 1995

Related U.S. Application Data

[63] Continuation-in-part of Ser. No. 33,750, Mar. 19, 1993, Pat. No. 5,534,827.

[30] Foreign Application Priority Data

| Mar. 30, 1992 | [JP] | Japan | 4-74471 |
| Feb. 8, 1993 | [JP] | Japan | 5-20072 |
| Sep. 9, 1994 | [JP] | Japan | 6-216183 |

[51] Int. Cl.$^6$ .................. H03C 1/00; H03C 3/00
[52] U.S. Cl. ............................................. 332/103
[58] Field of Search ................................ 332/103–105

[56] References Cited

U.S. PATENT DOCUMENTS

| 3,466,460 | 9/1969 | Connolly | 327/357 |
| 4,319,359 | 3/1982 | Wolf | 375/22 |
| 4,320,361 | 3/1982 | Kikkert | 332/112 |
| 4,965,531 | 10/1990 | Riley | 332/127 |
| 5,255,288 | 10/1993 | Ichihara | 332/104 |
| 5,293,406 | 3/1994 | Suzuki | 375/59 |

FOREIGN PATENT DOCUMENTS

| 54-55355 | 5/1979 | Japan | 332/103 |
| 2-138609 | 5/1990 | Japan | |
| 4-290337 | 10/1992 | Japan | 332/103 |

OTHER PUBLICATIONS

H. Inose, Y. Yasuda, J. Murakami, "A Telemetering System by Code Manipulation –Δ–Σ Modulation." IRE Trans on Space Electronics and Telemetry, Sep. 1962, pp. 204–209.

R. Schreier, "An Empirical Study of High–Order Single Bit Delta–Sigma Modulators," IEEE Trans. on CAS., vol. 40, No. 8, Aug. 1993.

S. Jantzi, W. Snelgrove, P. Ferguson, Jr., "A Fourth–Order Bandpass Sigma–Delta Modulator," IEEE Journal of Solid–State Circuits, vol. 28, No. 3 Mar. 1993.

"A Precise Digital Modulated Signal Generator", Masahiro Kuoroda, The 1991 Autumn Convention Thesis B–239 of The Institute of Electronics, Information, and Communication Engineers, (1991).

*Primary Examiner*—Andrew M. Dolinar
*Attorney, Agent, or Firm*—Finnegan, Henderson, Farabow, Garrett & Dunner, L.L.P.

[57] ABSTRACT

In a modulator, a linear converter inputs modulation signals and feed-back signals as an input vector and linearly converts the input vector. An encoder vector-quantizes the linearly converted vector and outputs the resultant signals as selection signals. A vector decoder decodes the encoded output into the plurality of feed-back signals. A selector selects and outputs one of signals with the same frequency and different phase or amplitude according to the selection signals.

22 Claims, 34 Drawing Sheets

P1 = D1
P2 = D1 · D2 + $\overline{D1}$ · $\overline{D2}$

|   | IR | Qr |
|---|----|----|
| a | 1  | 1  |
| b | -1 | 1  |
| c | -1 | -1 |
| d | 1  | -1 |
| e | 0  | 0  |

|   | Ir   | Qr    |
|---|------|-------|
| a | 1    | 0     |
| b | -1/2 | √3/2  |
| c | -1/2 | √3/2  |

FIG. 24

|   | I | II | III |
|---|---|----|-----|
| a | 1 | 2  | 3   |
| b | 2 | 3  | 1   |
| c | 3 | 1  | 2   |

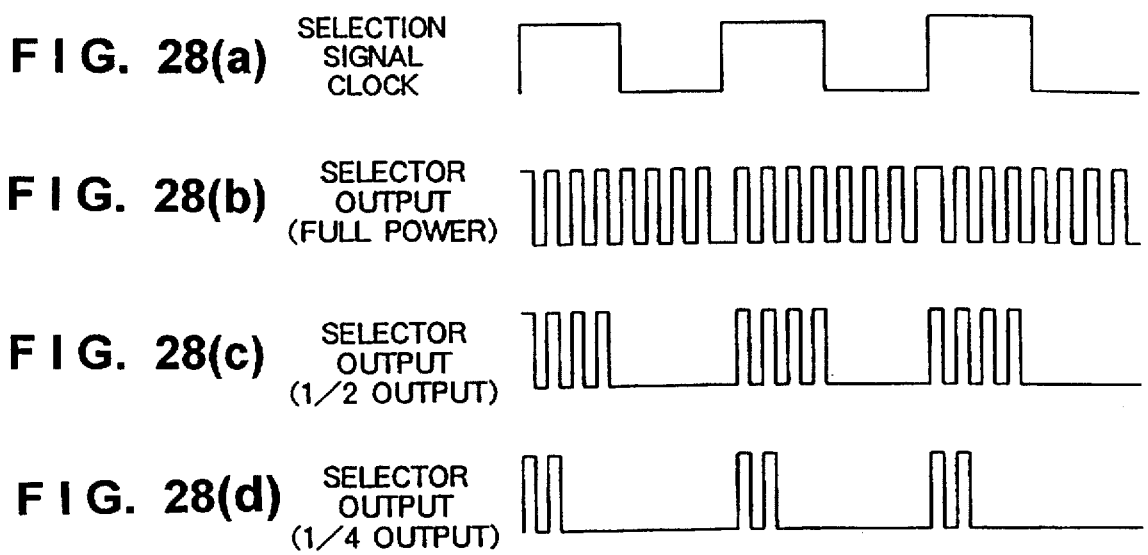
FIG. 28(a) SELECTION SIGNAL CLOCK
FIG. 28(b) SELECTOR OUTPUT (FULL POWER)
FIG. 28(c) SELECTOR OUTPUT (1/2 OUTPUT)
FIG. 28(d) SELECTOR OUTPUT (1/4 OUTPUT)
FIG. 29
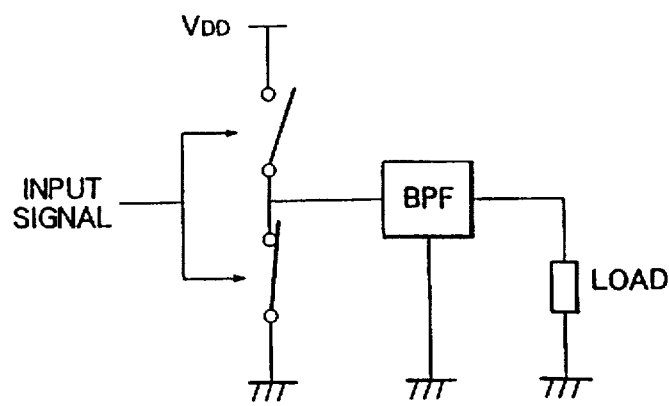

FIG. 38

| PHASE CONTROL SIGNAL | INPUT SIGNAL | | | |
|---|---|---|---|---|
| | a | b | c | d |
| $P_1$ | a | b | c | d |
| $P_2$ | b | c | d | a |
| $P_3$ | c | d | a | b |
| $P_4$ | d | a | b | c |

FIG. 39

| PHASE CONTROL SIGNAL | INPUT SIGNAL | | | |
|---|---|---|---|---|
| | a | b | c | d |
| $P_1$ | a | b | c | d |
| $P_2$ | b | c | d | a |
| $P_3$ | c | d | a | b |
| $P_4$ | d | a | b | c |
| $P_5$ | a | d | c | b |
| $P_6$ | b | a | d | c |
| $P_7$ | c | b | a | d |
| $P_8$ | d | c | b | a |

FIG. 43

| PHASE CONTROL SIGNAL | INPUT SIGNAL | | | | |
|---|---|---|---|---|---|
| | a | b | c | d | e |
| $P_1$ | a | b | c | d | e |
| $P_2$ | b | c | d | a | e |
| $P_3$ | c | d | a | b | e |
| $P_4$ | d | a | b | c | e |
| $P_5$ | a | d | c | b | e |
| $P_6$ | b | a | d | c | e |
| $P_7$ | c | b | a | d | e |
| $P_8$ | d | c | b | a | e |

FIG. 45

| PHASE CONTROL SIGNAL | INPUT SIGNAL | | | | | | | |
|---|---|---|---|---|---|---|---|---|
| | a | b | c | d | e | f | g | h |
| $P_1$ | a | b | c | d | e | f | g | h |
| $P_2$ | b | c | d | e | f | g | h | a |
| $P_3$ | c | d | e | f | g | h | a | b |
| $P_4$ | d | e | f | g | h | a | b | c |
| $P_5$ | e | f | g | h | a | b | c | d |
| $P_6$ | f | g | h | a | b | c | d | e |
| $P_7$ | g | h | a | b | c | d | e | f |
| $P_8$ | h | a | b | c | d | e | f | g |
| $P_9$ | a | h | g | f | e | d | c | b |
| $P_{10}$ | b | a | h | g | f | e | d | c |
| $P_{11}$ | c | b | a | h | g | f | e | d |
| $P_{12}$ | d | c | b | d | h | g | f | e |
| $P_{13}$ | e | d | c | b | a | h | g | f |
| $P_{14}$ | f | e | d | c | b | a | h | g |
| $P_{15}$ | g | f | e | d | c | b | a | h |
| $P_{16}$ | h | g | f | e | d | c | b | a |

MODULATOR

This is a continuation-in-part of application Ser. No. 08/033750, filed Mar. 19, 1993, now U.S. Pat. No. 5,534,827.

The present application claims priority of Japanese Patent Application No. Hei-4-74471 filed on Mar. 30, 1992, Japanese Patent Application No. Hei-5-20072 filed on Feb. 8, 1993, Japanese Patent Application No. Hei-5-226113, filed on Sep. 10, 1993, and Japanese Patent Application No. Hei-6-216183 filed on Sep. 9, 1994.

BACKGROUND OF THE INVENTION

1. Field of the Invention

The present invention relates to a modulator used for amplitude modulation or amplitude and phase modulation, in particular, to a modulator suitable for an integrated circuit.

2. Description of the Related Art

Nowadays, portable radio units such as portable telephone sets are being widely used. In these units, small size and low power consumption are very important factors to accomplish. In this circumference, it is desired to reduce the size and power consumption of modulation and demodulation circuits.

FIG. 30 is a block diagram showing the construction of an example of a conventional orthogonal modulator.

This orthogonal modulator comprises D/A converters 71 and 72, low-pass filters 73 and 74, a synthesizer 79, a $\pi/2$ phase shifter 80, mixers 77 and 78, and a composing unit 81. The D/A converters 71 and 72 each convert a digital modulation signal into an analog modulation signal. The low-pass filters 73 and 74 remove sampling noises contained in the outputs of the D/A converters 71 and 72. The synthesizer 79 generates a local signal. The $\pi/2$ phase shifter 80 shifts the phase of the frequency of the local signal received from the synthesizer 79 by $\pi/2$. The mixer 77 amplitude-modulates the output of the $\pi/2$ phase shifter 80 with the output of the low-pass filter 73. The mixer 78 amplitude-modulates the output of the synthesizer 79 with the output of the low-pass filter 74. The composing unit 81 composes the outputs of the mixers 77 and 78 and outputs an amplitude and phase modulation wave. The mixers 77 and 78 can be constructed of an amplitude modulator.

In the orthogonal modulator of this type, when the circuits downstream of the D/A converters 71 and 72 process analog signals, various errors and distortions take place. To reduce the distortion, a satisfactorily large bias current is required for a relevant signal. Thus, the current consumption tends to become large. This problem also takes place when a mixer is used for an amplitude modulator. In addition, an orthogonal modulator which performs a modulation with a high accuracy requires a compensation means such as a compensation circuit, a compensation signal generation circuit, or the like for compensating an error, thereby increasing the circuit scale.

In The 1991 Autumn Convention Thesis B-239 of The Institute of Electronics, Information, and Communication Engineers, a method for forming digital signals for a high accuracy orthogonal modulator is disclosed. However, in this method, digital signals with a large number of bits should be processed at high speed so as to improve the accuracy thereof. Thus, the circuit scale becomes large. In addition, the power consumption increases. In other words, this method is not suitable for portable radio terminals and so forth.

As described above, the conventional amplitude modulators or orthogonal modulators which process analog signals require satisfactorily large bias current, thereby increasing current consumption. On the other hand, modulators which form digital signals should process digital signals with a large number of bits at high speed, thereby increasing the circuit scale and power consumption.

SUMMARY OF THE INVENTION

The present invention is made from the above-mentioned point of view.

A first object of the present invention is to provide a modulator having a small distortion and small power consumption.

A second object of the present invention is to provide a modulator having a high accuracy modulation with a small circuit scale.

A third object of the present invention is to provide a modulator which allows the size of a final product to be decreased.

A fourth object of the present invention is to provide a modulator which is suitable for a microcomputer and where a control system can be constructed without necessity of an interface circuit or with a simple interface circuit.

A fifth object of the present invention is to provide a modulator having a large degree of freedom of designing the frequency characteristic of quantization noise and a low clock frequency, thereby decreasing the power consumption.

A sixth object of the present invention is to provide an amplitude and phase modulator for pre-storing simulation result of delta-sigma modulation to a memory and reading it corresponding to a modulation input so as to reduce the data amount of simulation result and thereby the storage capacity of the memory.

To accomplish the above object, a modulator according to the present invention has signal conversion means for converting a modulation signal into selection signals according to said modulation signal, said signal conversion means comprising, a linear converter for inputting modulation signals and feed-back signals as an input vector and for linearly converting said input vector, an encoder for vector-quantizing the linearly converted vector and for outputting the resultant signals as selection signals, and a vector decoder for decoding the encoded output into said plurality of feed-back signals, and selection means for selecting and outputting one of signals with the same frequency and different phase or amplitude according to said selection signals.

According to the present invention, since part or all of the amplitude modulator and orthogonal modulator can be constructed of a switching circuit, the influence of modulation error due to deviation of device values can be prevented. In addition, since only signals of one bit are handled, the circuit scale can be decreased in comparison with that of the conventional digital type system. Moreover, since the switching circuit does not have a distortion unlike the analog circuit, the power consumption can be decreased in the range that the switching operation speed is not affected. By averaging the output of a sequence of $\cos^\omega t$, $\cos^\omega t$, and $-\cos^\omega t$, $\frac{1}{3} \cos^\omega t$ can be obtained. Likewise, by averaging the output of a sequence of $\cos^\omega t$, $\cos^\omega(t+\phi)$, $\cos^\omega t$, $\cos(^\omega t+\phi)$, and so forth, $\frac{1}{2} \cos^\omega t + \frac{1}{2} \cos(^\omega t+\phi) = \cos(\phi/2) \cos(^\omega t+\phi/2)$ is obtained.

As described above, to obtain a required signal, it is not necessary to use signals whose phases which differs by 90° as reference signals. For example, as with three phase AC, by switching signals with phases which differs by 120°, an amplitude and phase modulation can be accomplished. In this case, part of the frequency components is a desired signal. Thus, signals should be switched so that quantization noise is distributed much in a frequency band far apart from the frequency band of the desired wave. This switching signal is generated by a vector delta sigma modulator. An amplitude and phase modulator using two sets of delta sigma modulators should output signals with the same amplitude and whose phases differ by 90° each other. However, by using the vector delta sigma modulation, an output with any combination of amplitude and phases can be obtained. In addition, since a loop filter of a delta sigma modulator handles a scalar signal, its transfer function can accomplish only a rational function of real coefficients. Thus, the distribution of quantization noise of the output of the amplitude and phase modulator is symmetrical to the carrier frequency. On the other hand, when the vector delta sigma modulator is used, a linear modulator is equivalent to the loop filter of the delta sigma modulator. Thus, the transfer function of complex coefficients can be apparently accomplished. Thus, the distribution of quantization noise of the output of the amplitude and phase modulator can become asymmetrical to the carrier frequency. For example, in the situation that a signal with a center frequency of 901 MHz is transmitted with a radio system which strictly restricts an unnecessary radiation power ranging from 900 MHz to 910 MHz, when a delta sigma modulator is used, since the distribution of quantization noise is symmetrical to the center frequency, the delta sigma modulator should be designed to decrease the amount of quantization noise in the range from 892 MHz to 910 MHz. On the other hand, since the vector delta sigma modulator can allow the distribution of quantization noise to become asymmetrical, the vector delta sigma modulator can be designed to decrease the amount of the quantization noise in the range from 900 MHz to 910 MHz. In other words, to decrease the amount of noise in a wide frequency range, the frequency to be sampled should be raised. However, the higher the speed of the circuit becomes, the more the power is consumed. On the other hand, since the vector delta sigma modulation has a large degree of freedom of designing the frequency characteristic of quantization noise and can lower the sampling frequency, the power consumption thereof can be decreased.

According to the present invention, since the phase convecting means converts a signal sequence that is output from the signal reproducing means into a signal sequence which is rotated on a phase plane or into a signal sequence that is line-symmetrical against a predetermined axis, the amount of data to be stored can be reduced. As the amount of data is reduced, the amplitude and phase modulator can be accomplished by an integrated circuit with a small amount of memory or a small chip area. In the phase modulation system, a differential encoding system is often used. However, according to the present invention, since the phase converter deals with the differential encoding process, the differential encoding device can be omitted.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 24 is a table for explaining an output of a selector shown in FIG. 23;

FIG. 28 is a schematic diagram showing waveforms for explaining an output power control system according to the present invention;

FIG. 29 is a circuit diagram of a class D amplifier using the output power control system according to the present invention.

FIG. 38 is a table showing the relation of input and output of the phase converter of the amplitude and phase modulator according to the tenth embodiment of the present invention;

FIG. 39 is another table showing the relation of input and output of the phase converter of the amplitude and phase modulator according to the tenth embodiment of the present invention;

FIG. 43 is a table showing the relation of input and output of the phase converter of the amplitude and phase modulator according to the thirteenth embodiment of the present invention;

FIG. 45 is a table showing the relation of input and output of the phase converter of the amplitude and phase modulator according to the fourteenth embodiment of the present invention;

DESCRIPTION OF PREFERRED EMBODIMENTS

Next, with reference to the accompanying drawings, embodiments according to the present invention will be described.

Figure 46:
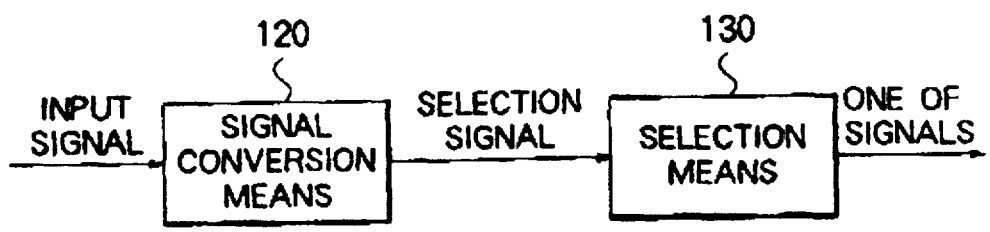
FIG. 46 is a block diagram showing the construction of a first modulator according to the present invention.

FIG. 46 is a block diagram showing the construction of a first modulator according to the present invention.

An input signal is sent to a signal conversion means 120. The signal conversion means 120 converts the input signal into selection signals according to the input signal. The signal conversion means 120, for instance, corresponds to a delta sigma modulator 1 shown in FIG. 1 or a vector delta sigma modulator 43 shown in FIG. 12.

The selection signals output from the signal conversion means 120 are sent to a selection means 130. The selection means 130 selects and outputs one of signals with the same frequency and different phase or amplitude according to the selection signals. The selection means 130, for instance, a multiplication circuit 2 shown in FIG. 1 or a selector 44 shown in FIG. 12.

Figure 1:
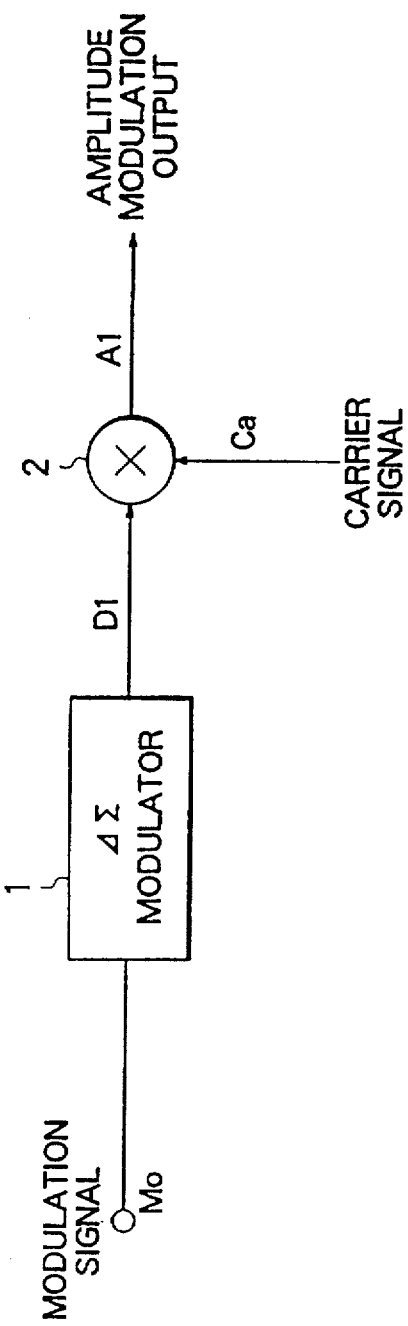
FIG. 1 is a block diagram showing the construction of an amplitude modulator of a first embodiment according to the present invention.

FIG. 1 is a block diagram sowing the construction of an amplitude modulator of a first embodiment according to the present invention.

A digital or analog modulation signal Mo is sent to a delta sigma converter 1. The delta sigma converter 1 converts the signal Mo into a binary signal D1. The signal D1 and a carrier signal Ca are sent to a multiplication circuit 2. The multiplication circuit 2 changes the phase of the carrier signal Ca to the normal phase or opposite phase according to the signal D1 and outputs the resultant signal as an amplitude modulation wave A1. Although an analog multiplication circuit such as a Gilbert multiplication circuit or a diode ring modulation circuit can be used for the multiplication circuit 2, an exclusive-OR circuit can be used. Even if an analog multiplication circuit is used, since the amplitude of input and output signals are constant, it is not necessary to use a circuit of a linear type unlike the conventional amplitude modulation circuit.

When the delta sigma modulator 1 is of a ternary type, the output of the multiplication circuit 2 is one of normal phase, none, and opposite phase. For the multiplication circuit 2, an analog multiplication circuit or ternary logic circuit is used.

A delta sigma modulator 1 shown in FIG. 1 can be substituted with another modulation circuit which outputs a binary or ternary signal sequence whose average value becomes a desired analog signal. For example, the delta sigma modulator 1 can be substituted with for example a pulse width modulator (PWM) or another pulse density modulator. In particular, a digital signal can be transmitted by a system having a memory as a conversion circuit, memory addresses as modulation signals, and a circuit which outputs a binary signal sequence.

On a time axis, the amplitude modulator 1 outputs signals with the same amplitude and where a desired signal and unnecessary signals such as quantization noise are superimposed. However, on a frequency axis, the component of the desired signal is present in the vicinity of the carrier frequency. The components of the unnecessary signals are distributed much in a frequency band comparatively apart from the carrier frequency rather than in the vicinity of the carrier frequency. Thus, by removing the components of the unnecessary signals with a filter, the desired amplitude modulation signal can be obtained.

Figure 47:
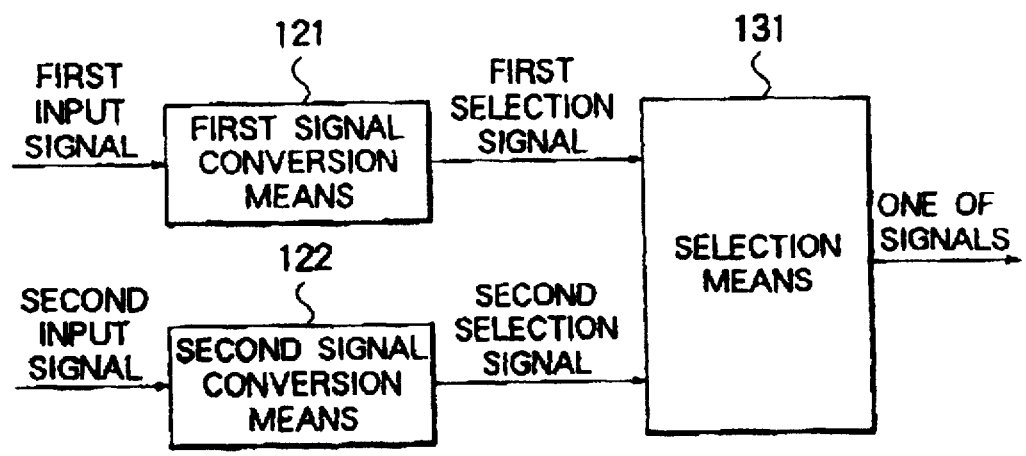
FIG. 47 is a block diagram showing the construction of a second modulator according to the present invention.

FIG. 47 is a block diagram showing the construction of a second modulator according to the present invention.

A first input signal is sent to a first signal conversion means 121. A second input signal is sent to a second signal conversion means 122. The first signal conversion means 121 converts the first input signal into first selection signals according to the first input signal. The second signal conversion means 122 converts the second input signal into the second selection signals according to the second input signal. The first and second signal conversion means 121 and 122, for instance, corresponds to delta sigma modulators 7 and 8 shown in FIG. 2, delta sigma modulators 13 and 14 shown in FIG. 3, delta sigma modulators 23 and 24 shown in FIG. 5, or delta sigma modulators 30 and 31 shown in FIG. 7.

The first and second selection signals output from the first and second signal conversion means 121 and 122 are sent to an selection means 131. The selection means 131 selects and outputs one of signals with the same frequency and different phase or amplitude according to the first and second selection signals.

Figure 2:
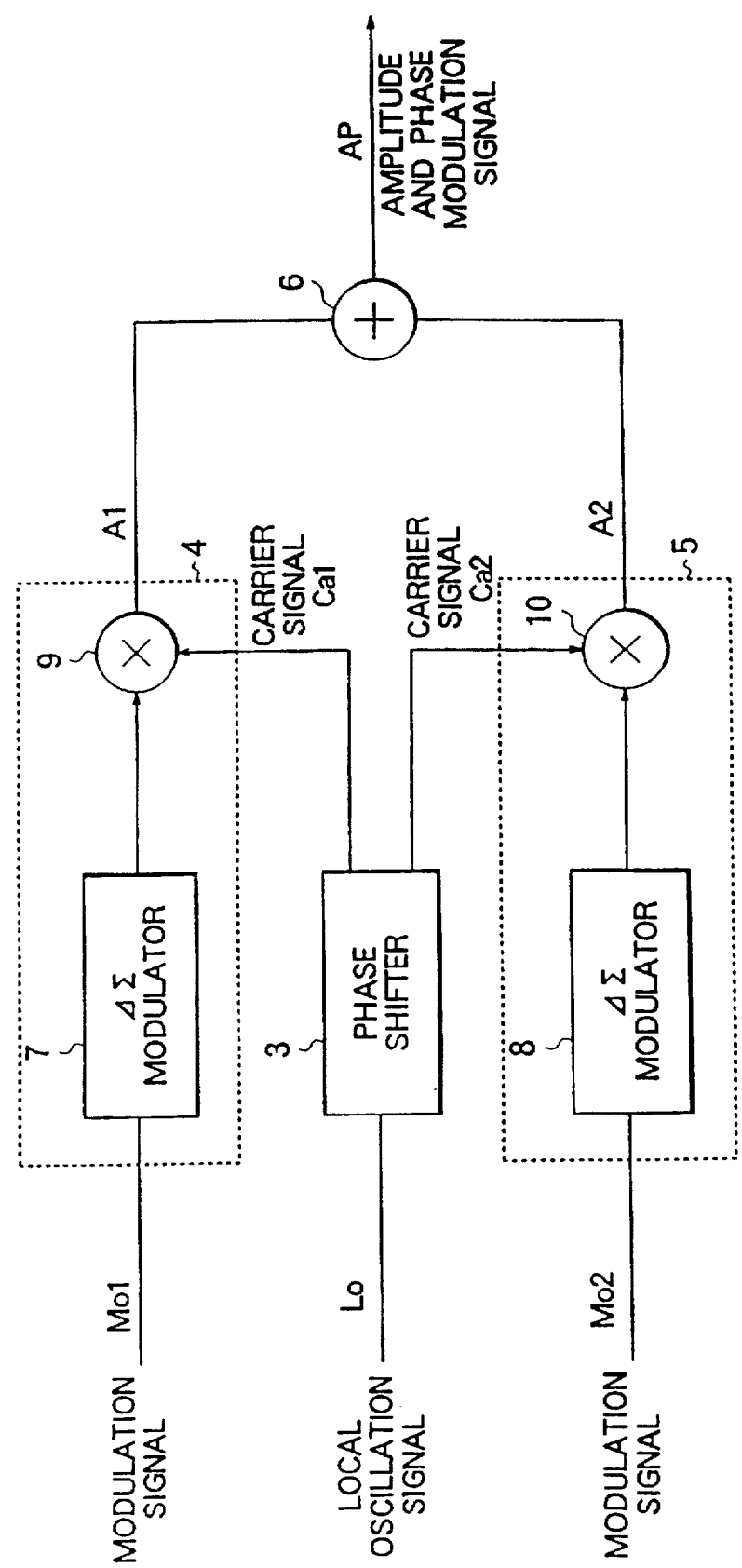
FIG. 2 is a block diagram showing the construction of an orthogonal modulator of a second embodiment according to the present invention.

FIG. 2 is a block diagram showing the construction of an orthogonal modulator of a second embodiment according to the present invention.

In the case that when (D1, D2) is (1, 1) Ca1 is output, when (D1, D2) is (1, −1) Ca2 is output, when (D1, D2) is (−1, −1) Ca3 is output, and when (D1, D2) is (−1, 1) Ca4 is output, these signals can be represented by the following expression (logical expression 1).

$$D1 \cdot D2 \cdot Ca1 + D1 \cdot \overline{D2} \cdot Ca2 + \overline{D1} \cdot \overline{D2} \cdot Ca3 + \overline{D1} \cdot D2 \cdot Ca4 \qquad \text{(logical expression 1)}$$

When the logical expression 1 is modified according to the law of de Morgan, the following expression (logical expression 2) is obtained.

$$\overline{\overline{(D1 \cdot D2 \cdot Ca1)} \cdot \overline{(D1 \cdot \overline{D2} \cdot Ca2)} \cdot \overline{(\overline{D1} \cdot \overline{D2} \cdot Ca3)} \cdot \overline{(\overline{D1} \cdot D2 \cdot Ca4)}} \qquad \text{(logical expression 2)}$$

A local oscillation signal Lo is sent to a phase shifter 3. The phase shifter 3 outputs carrier signals Ca1 and Ca2 whose phases differ by 90° each other. The modulation signal Mo1 and the carrier signal Ca1 are sent to an amplitude modulator 4. The modulation signal Mo2 and the carrier signal Ca2 are sent to an amplitude modulator 5. The construction of the amplitude modulators 4 and 5 is similar to that of the amplitude modulator described in the first embodiment (see FIG. 1). Thus, the amplitude modulators 4 and 5 output amplitude modulation signals A1 and A2, respectively. These signals A1 and A2 are sent to an analog signal composing unit 6. The unit 6 outputs an amplitude and phase modulation signal AP. In FIG. 2, reference numerals 7 and 8 represent delta sigma modulators. Reference numerals 9 and 10 represent multiplication circuits.

Figure 3:
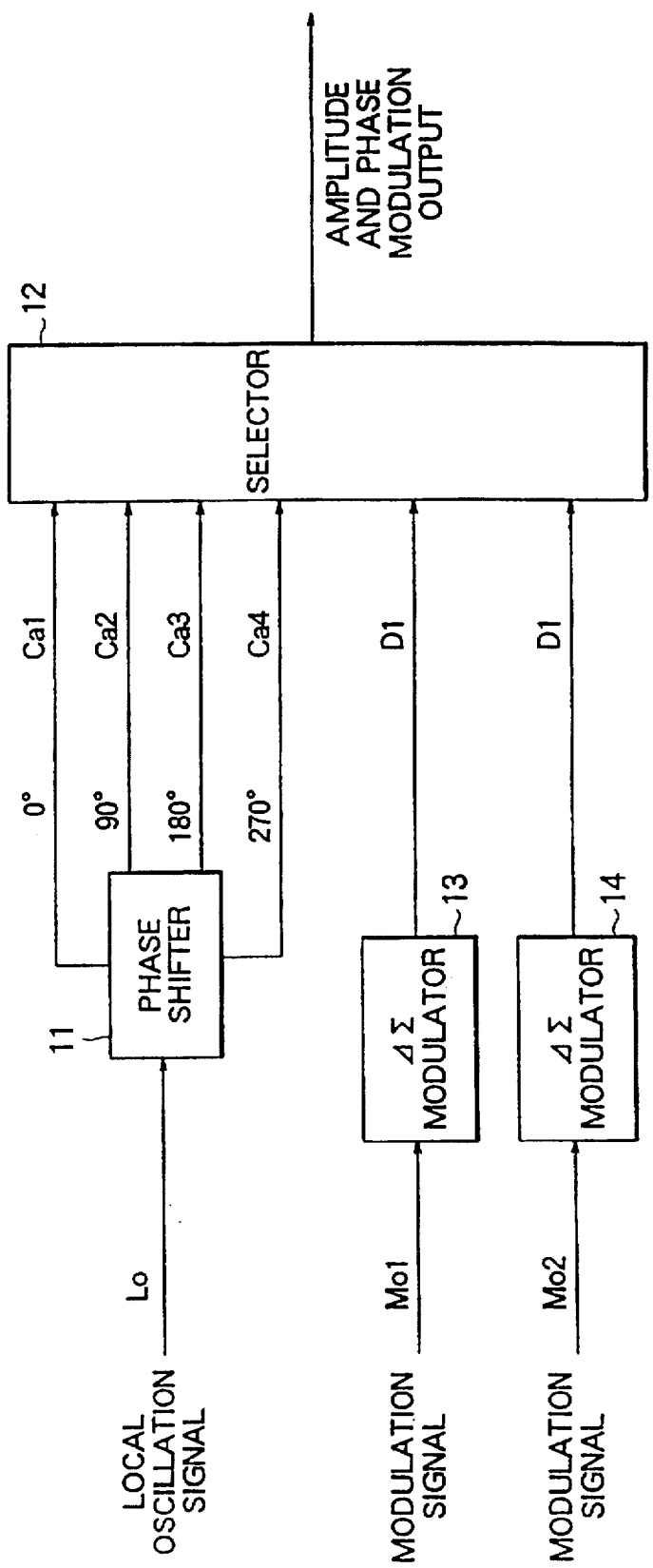
FIG. 3 is a block diagram showing the construction of an orthogonal modulator of a third embodiment according to the present invention.

FIG. 3 is a block diagram showing the construction of an orthogonal modulator of a third embodiment according to the present invention.

A local oscillation signal Lo is sent to a phase shifter 11. The phase shifter Lo separates the signal Lo into four carrier signals Ca1, Ca2, Ca3, and Ca4 whose phases are 0°, 90°, 180°, and 270°, respectively. These carrier signals are sent to a selector 12. In addition, output signals D1 and D2 of two delta sigma modulators 13 and 14 are sent to the selector 12. The two delta sigma modulators 13 and 14 can be substituted with other conversion circuits which output a binary signal sequence whose average becomes a desired analog signal (described in the first embodiment).

The selector 12 selects and outputs one of the four input signals Ca1, Ca2, CA3, and CA4 according to the two input signals D1 and D2. For example, in the case that when (D1, D2) are (1, 1) Ca1 is output, when (D1, D2) is (1, −1) Ca2 is output, when (D1, D2) is (−1, −1) Ca3 is output, and when (D1, D2) is (−1, 1), Ca4 is output, an amplitude and phase modulation signal which is similar to that of the second embodiment can be obtained. In this amplitude and phase modulation output, the component of a desired signal and the components of unnecessary signals are superimposed. The amplitude of the output is constant. By removing the components of the unnecessary signals distributed much in a frequency band comparatively apart from the carrier frequency with a filter, a desired amplitude and phase modulation signal can be obtained.

Figure 4:
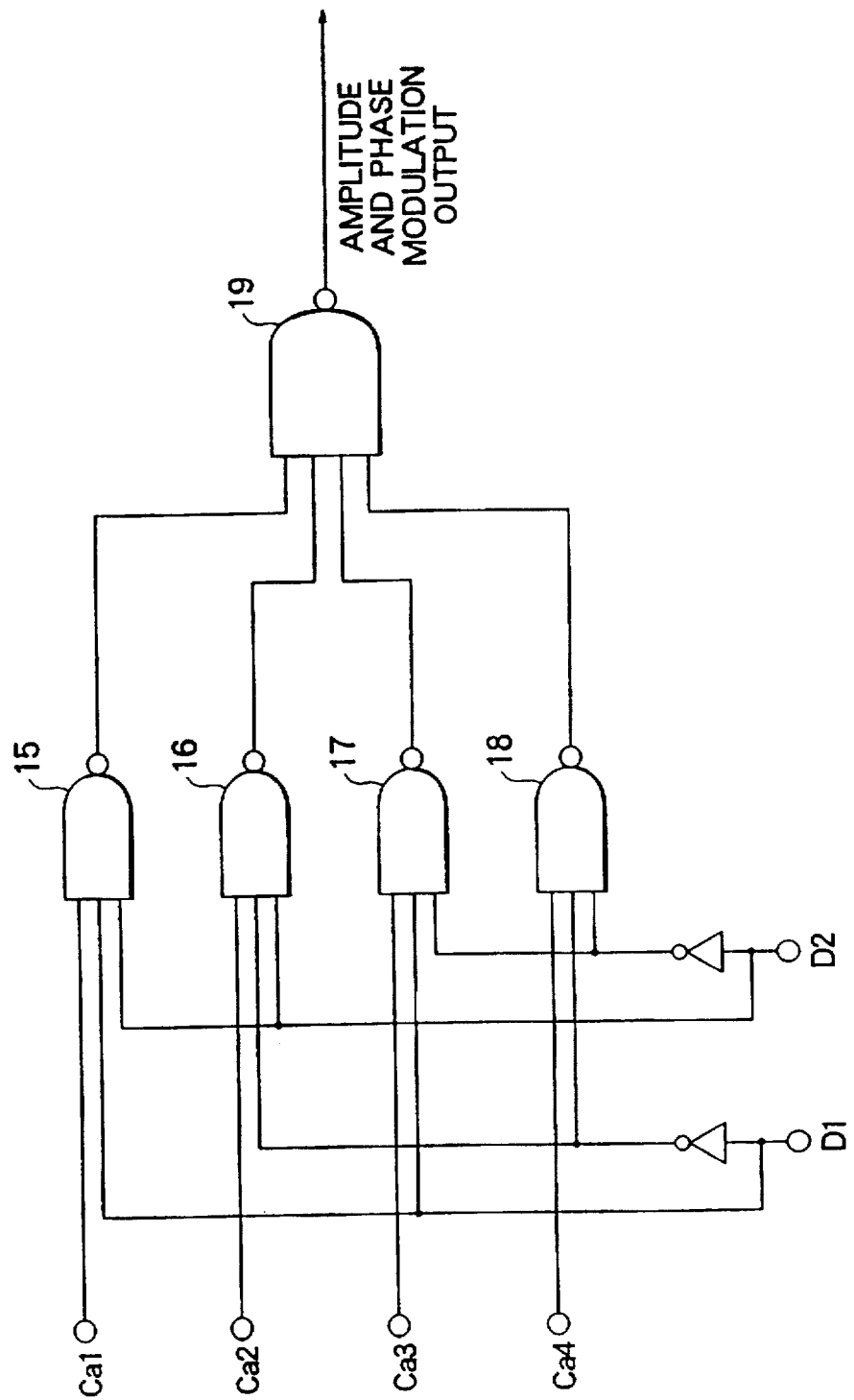
FIG. 4 is a circuit diagram showing the construction of an example of the selector of the third embodiment according to the present invention.

FIG. 4 is a circuit diagram showing the construction of an example of the selector 12 of the third embodiment. Normally, in a logical circuit, data is represented by two values 1 and 0. However, in this example, two values 1 and −1 are used.

The logical circuit shown in FIG. 4 is equivalent to the logical expression 2.

A three-input NAND circuit outputs −1 only when all inputs thereof is 1. In FIG. 4, when (D1, D2) are (1, 1), a three-input NAND circuit 15 which inputs Ca1 outputs the inverted signal of Ca1. Since the other three-input NAND circuits 16, 17, and 18 input at least one "−1", they always output 1. Thus, a four-input NAND circuit 19 outputs the inverted signal of the inverted signal of Ca1, namely Ca1. Likewise, when (D1, D2) are (1, −1), Ca2 is selected and output. When (D1, D2) are (−1, −1), Ca3 is selected and output. When (D1, D2) are (−1, 1), Ca4 is selected and output.

Figure 5:
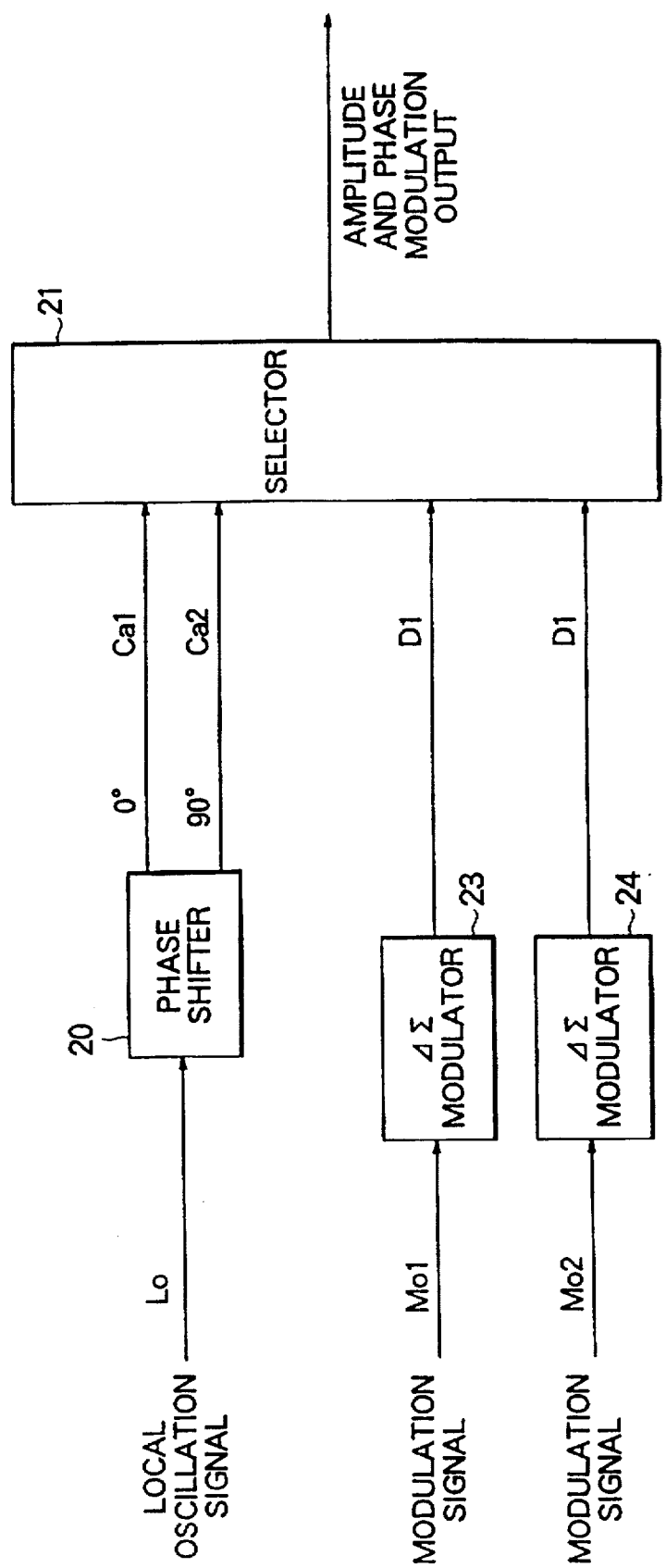
FIG. 5 is a block diagram showing an orthogonal modulator of a fourth embodiment according to the present invention.

FIG. 5 is a block diagram showing an orthogonal modulator of a fourth embodiment according to the present invention.

A carrier signal is sent to a phase shifter 20. The phase shifter 20 separates the carrier signal into two signals whose phases are 0° and 90°. The separated signals are sent to a selector 21. In addition, output signals D1 and D2 of two sigma delta converters 23 and 24 are sent to the selector 21. The delta sigma modulators 23 and 24 can be substituted with other conversion circuits which output a binary signal sequence whose average is a desired analog signal.

The selector 21 selects and outputs one of the input signals Ca1, Ca2, and the inverted signals thereof according to the two input signals D1 and D2. For example, when (D1, D2) are (1, 1), the selector 21 outputs Ca1. When (D1, D2) are (1, −1), the selector 21 outputs Ca2. When (D1, D2) are (−1, −1), the selector 21 outputs the inverted signal of Ca1. When (D1, D2) are (−1, 1), the selector 21 outputs the inverted signal of Ca2. The signals selected and output by the selector 21 can be represented by the following expression (logical expression 3).

$$D1 \cdot D2 \cdot Ca1 + D1 \cdot D2 \cdot Ca2 + D1 \cdot D2 \cdot Ca1 + D1 \cdot D2 \cdot Ca2 \qquad \text{(logical expression 3)}$$

Figure 6:
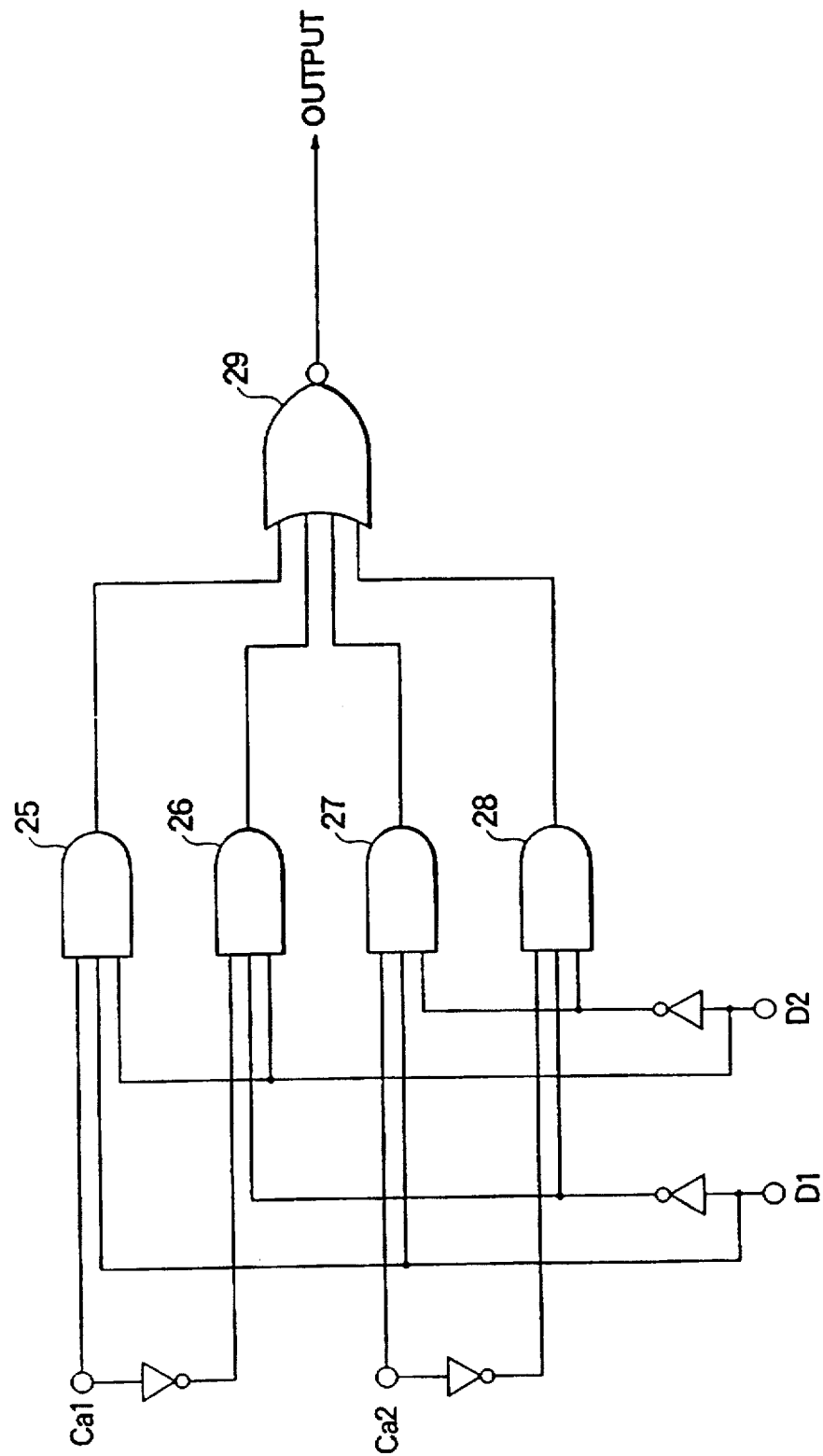
FIG. 6 is a circuit diagram showing the construction of a circuit equivalent to the logical expression 3.

FIG. 6 is a circuit diagram showing the construction of a circuit equivalent to the logical expression 3. The circuit of the figure comprises three-input AND circuits 25 to 28 and a four-input OR circuit 29. This circuit outputs a signal similar to that of the third embodiment.

Figure 7:
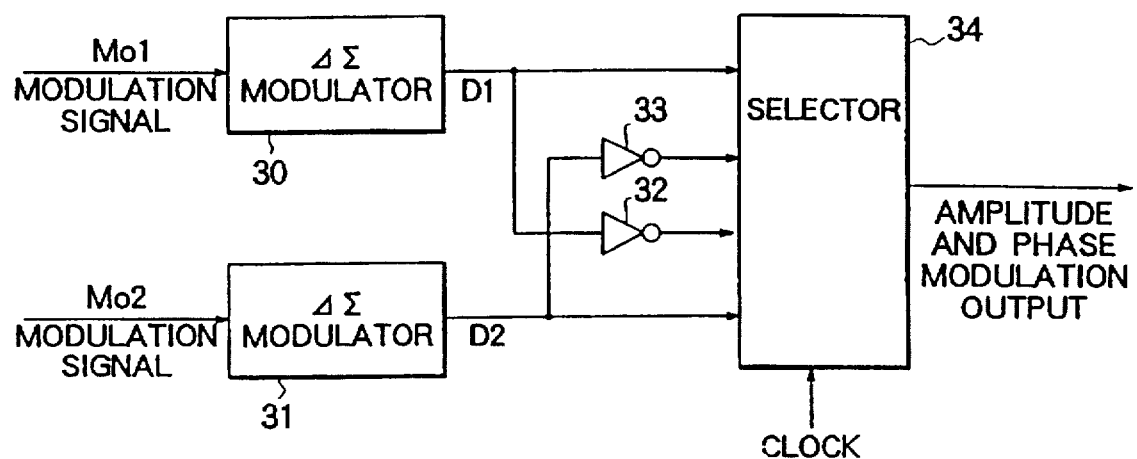
FIG. 7 is a block diagram showing the construction of an orthogonal modulator of a fifth embodiment according to the present invention.

FIG. 7 is a block diagram showing the construction of an orthogonal modulator of a fifth embodiment according to the present invention.

Figure 8:
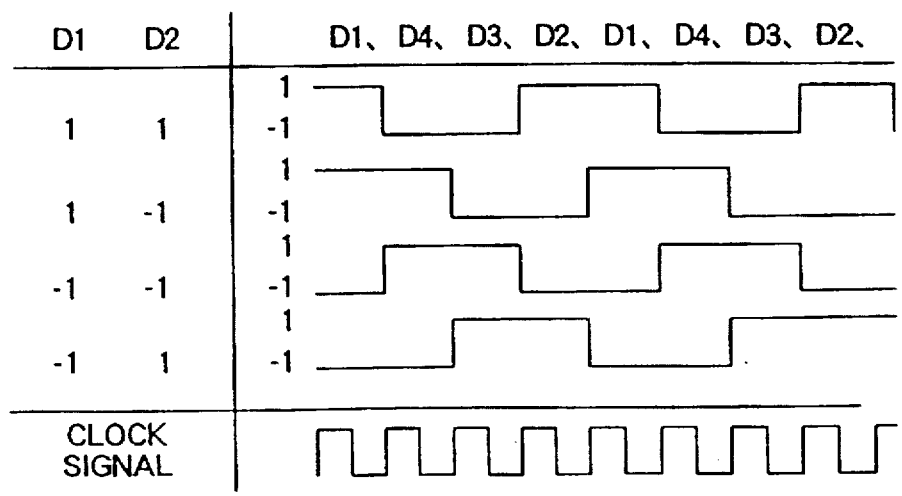
FIG. 8 is a timing chart showing the relation of input and output of the selector of the fifth embodiment according to the present invention.

Two delta sigma modulators 30 and 31 outputs signals D1 and D2, respectively. These signals are sent to a selector 34. In addition, these signals D1 and D2 are sent to inverters 32 and 33, respectively. The inverters 32 and 33 output the inverted signals of D1 and D2 as D3 and D4, respectively. The inverted signals D3 and D4 are sent to the selector 34. Moreover, the selector 34 receives a clock signal with a frequency four times higher than the frequency of a carrier. The selector 34 successively selects and outputs D1, D4, D3, and D2 whenever it receives a clock pulse. As a result, as shown in FIG. 8, the selector 34 outputs the signals D1, D4, D3, and D2 in the following manner. When (D1, D2) are (1, 1), the selector 34 repeatedly outputs 1, −1, −1, 1 in the order of D1, D4, D3, and D2. When (D1, D2) are (1, −1), the selector 34 repeatedly outputs 1, 1, −1, −1. When (D1, D2) are (−1, −1), the selector 34 repeatedly outputs −1, 1, 1, −1. When (D1, D2) are (−1, 1), the selector 34 repeatedly outputs −1, −1, 1, 1. Thus, an output which is similar to the above-mentioned output is obtained.

When each of D1 and D2 has three values −1, 0, and 1, by successively selecting and outputting D1, D2, and the inverted signals thereof D3, and D4 according to a clock signal, an orthogonal modulator can be formed.

Figure 9:
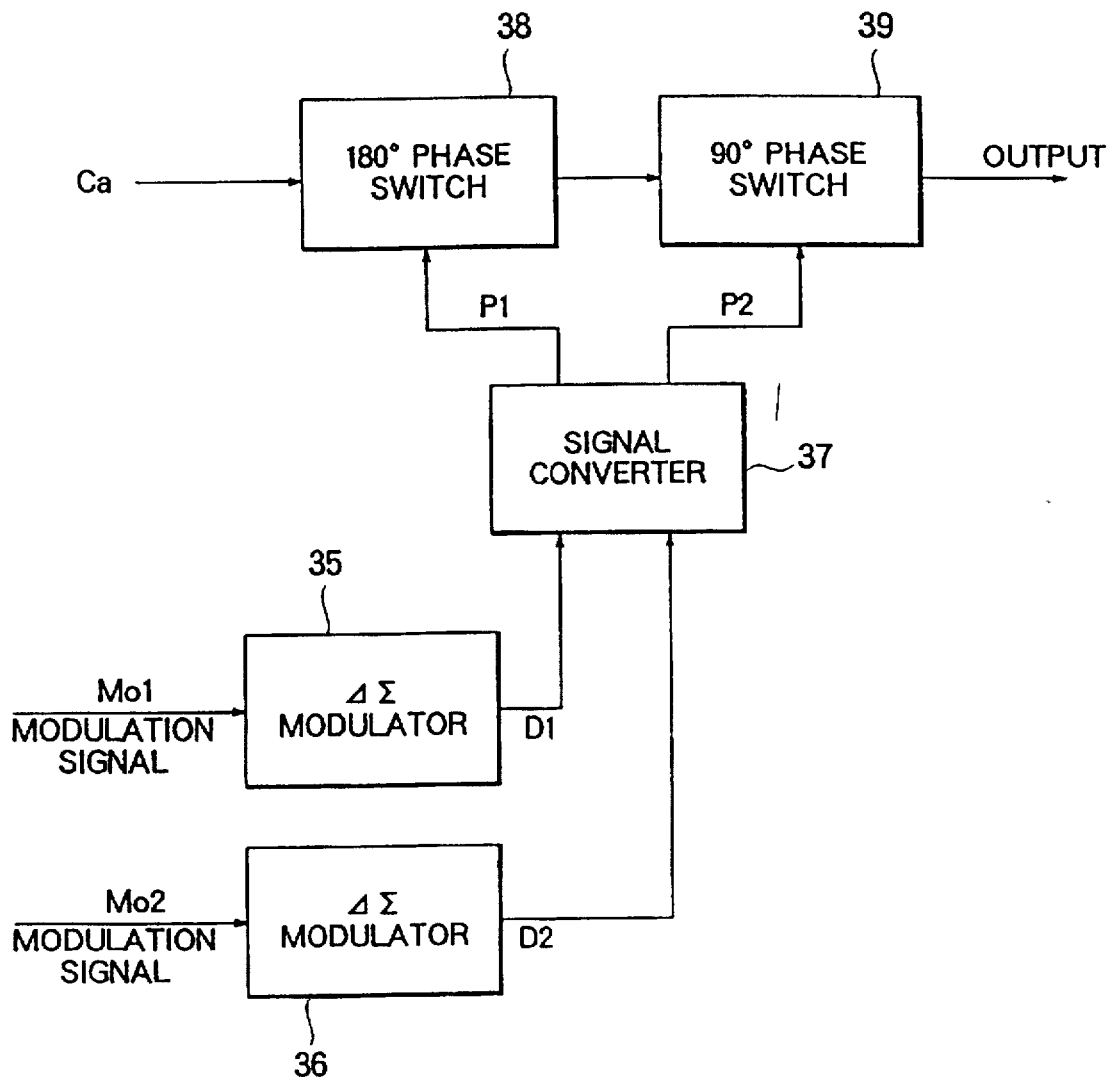
FIG. 9 is a block diagram showing the construction of an orthogonal modulator of a sixth embodiment according to the present invention.

FIG. 9 is a block diagram showing the construction of an orthogonal modulator of a sixth embodiment according to the present invention.

Two delta sigma modulators 35 and 36 outputs signals D1 and D2, respectively. These signals D1 and D2 are sent to a signal converter 37. The signal converter 37 converts the signals D1 and D2 into control signals P1 and P2 for a phase switch, respectively. A local oscillation signal Ca is sent to a 180° phase switch 38. The 180° phase switch 38 outputs the signal Ca with a phase of 0° or 180° according to the control signal P1. The resultant signal is sent to a 90° phase switch 39. The 90° phase switch 39 outputs the signal Ca with a phase of 0° or 90° according to the control signal P2. As a result, the output of the 90° phase shifter 39 is similar to that of the third embodiment of the present invention. It should be noted that even if the positions of the 180° phase switch 38 and the 90° phase switch 39 are changed each other, an output similar thereto can be obtained.

Figure 10:
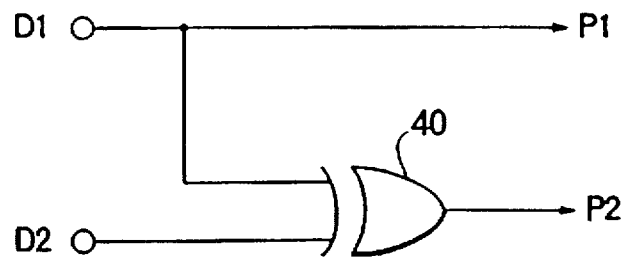
FIG. 10 is a circuit diagram showing the construction of an example of the signal conversion circuit of the sixth embodiment according to the present invention.

FIG. 10 is a circuit diagram showing the construction of an example of the signal converter 37 of the sixth embodiment according to the present invention. The signal converter 37 is constructed of an exclusive-OR circuit 40.

In the case that when P1 and P2 are 1 and that the phase of the output of the phase switch is 0°, when (D1, D2) are (1,1), the phase of the output is 0°; when (D1, D2) are (1, −1), the phase of the output is 90°; when (D1, D2) are (−1, −1), the phase of the output is 180°; and when (D1, D2) are (−1,1), the phase of the output is 270°.

Figure 11:
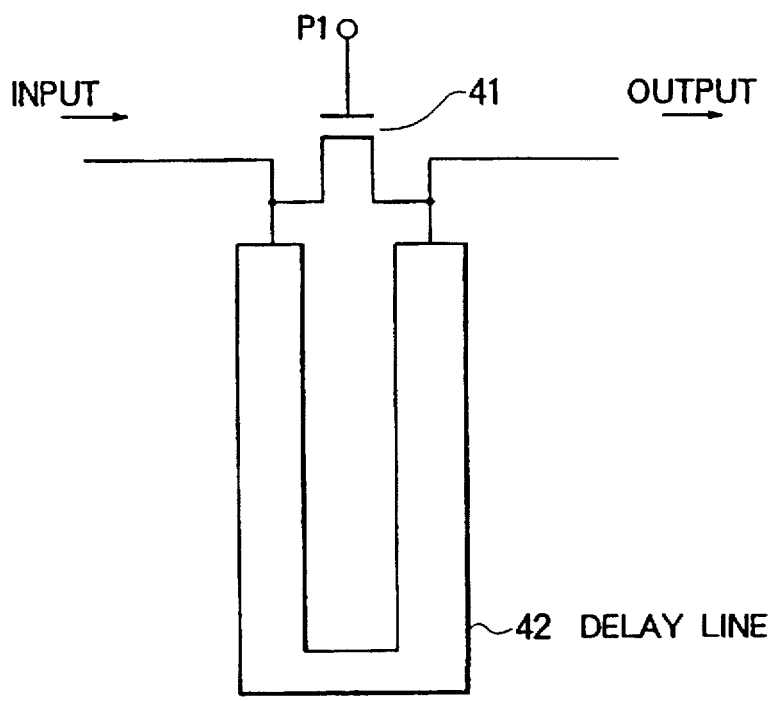
FIG. 11 is a circuit diagram showing the construction of an example of the phase switch of the sixth embodiment according to the present invention.

FIG. 11 is a circuit diagram showing the construction of an example of the phase switch of the sixth embodiment according to the present invention.

When the input and output of the phase switch are short-circuited by a switch 41 according to a control signal P1, the phase switch outputs a signal with a phase delay of 0°. When the input and output of the phase switch is open according to the control signal, the phase switch outputs a signal with a phase delay of 90° or 180° according to the length of a delay line 42.

Figure 12:
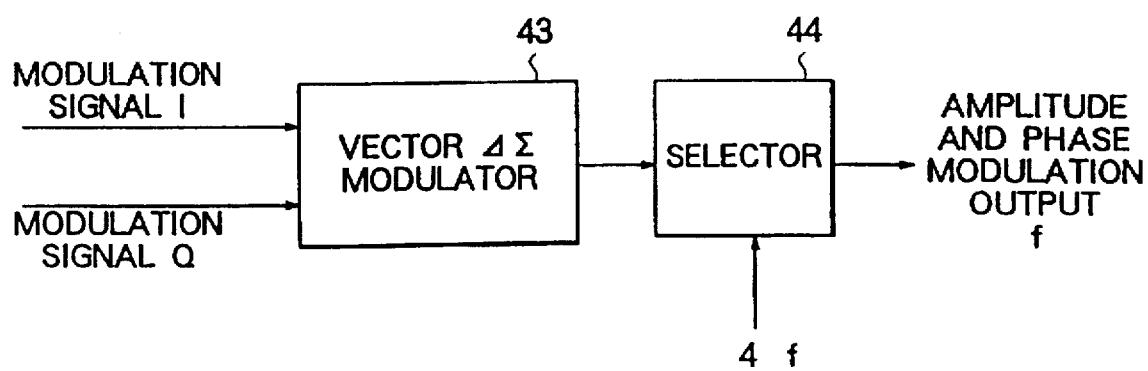
FIG. 12 is a block diagram showing the construction of an amplitude and phase modulator of a seventh embodiment according to the present invention.
Figure 13:
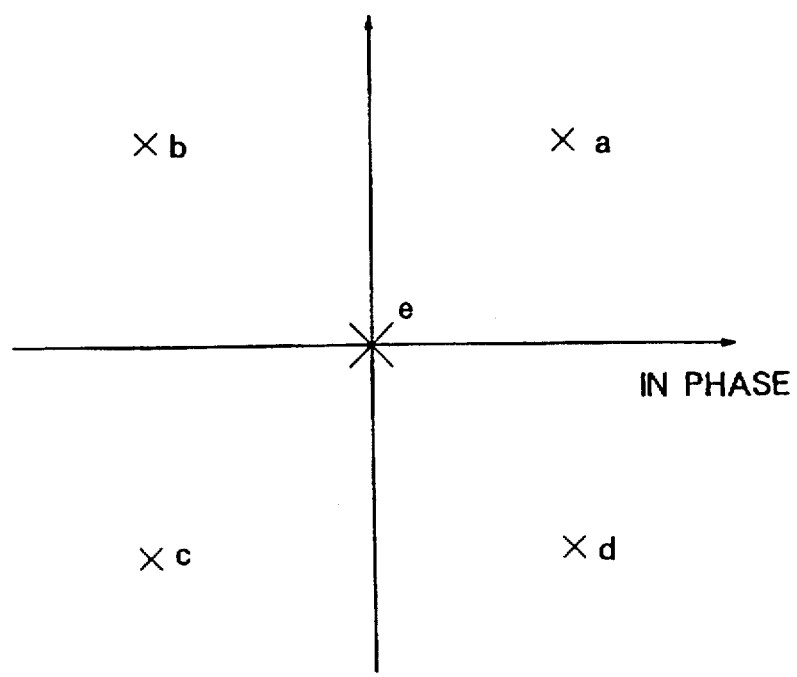
FIG. 13 is a schematic diagram for explaining an output of a selector shown in FIG. 12.

FIG. 12 is a block diagram showing the construction of an amplitude and phase modulator of a seventh embodiment according to the present invention. Modulation signals I and Q are sent to a vector delta sigma modulator 43. The modulator 43 converts the input signals I and Q into a sequence of five symbols a, b, c, d, and e which are selection signals. These signals are sent to a selector 44. When the selection signal a is sent to the selector 44, the selector 44 outputs a first signal according to point a on a phase plane shown in FIG. 13. Likewise, when the selection signals b, c, d, and e are sent to the selector 44, the selector 44 outputs first signals according to points b, c, d, and e on the phase plane of the figure, respectively. The selector 44 receives a reference signal with a frequency 4f which is four times higher than the frequency of a required output first signal. A frequency division circuit be contained in the selector 44 generates four first signals according to points a to d on the phase plane. The signal e represents the state where the output is stopped. Since the selector 44 outputs four first signals with the same amplitude and phases which differ each other and a signal which represents the state where the output is stopped. The phases of these output signals are indicated by the points on the phase plane shown in FIG. 13. Thus, the selector 44 can be constructed of a switching circuit.

Figure 14:
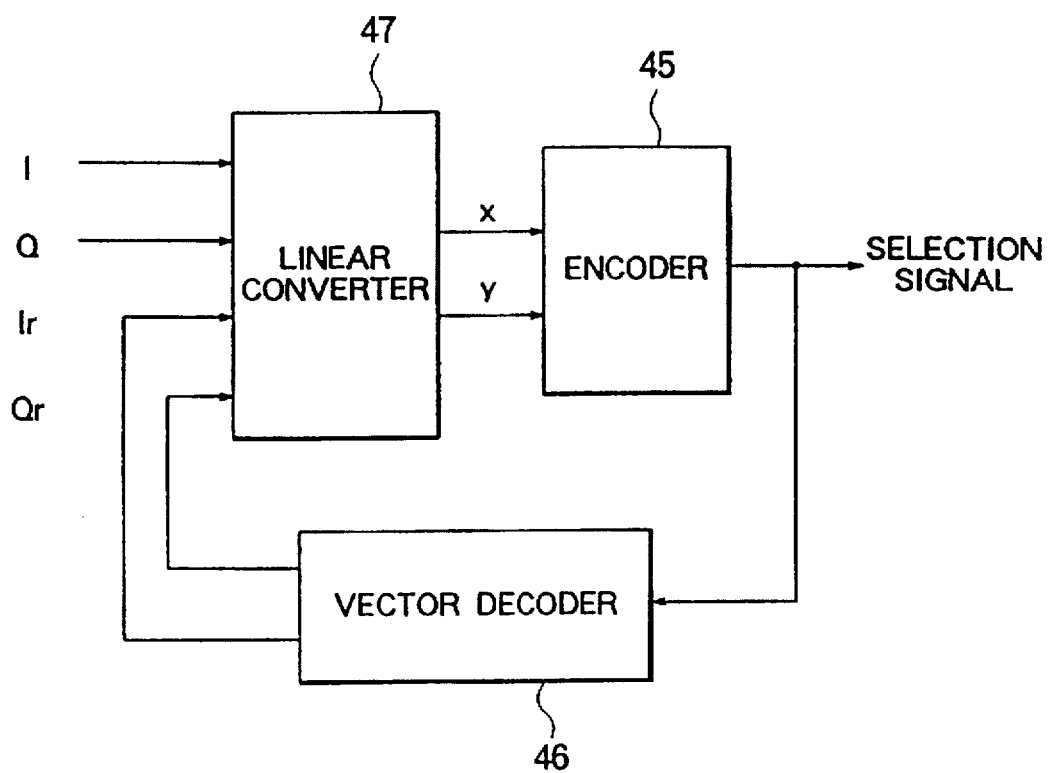
FIG. 14 is a block diagram showing the construction of the vector delta sigma modulator for use in the amplitude and phase modulator shown in FIG. 12.
Figures 15, 16:
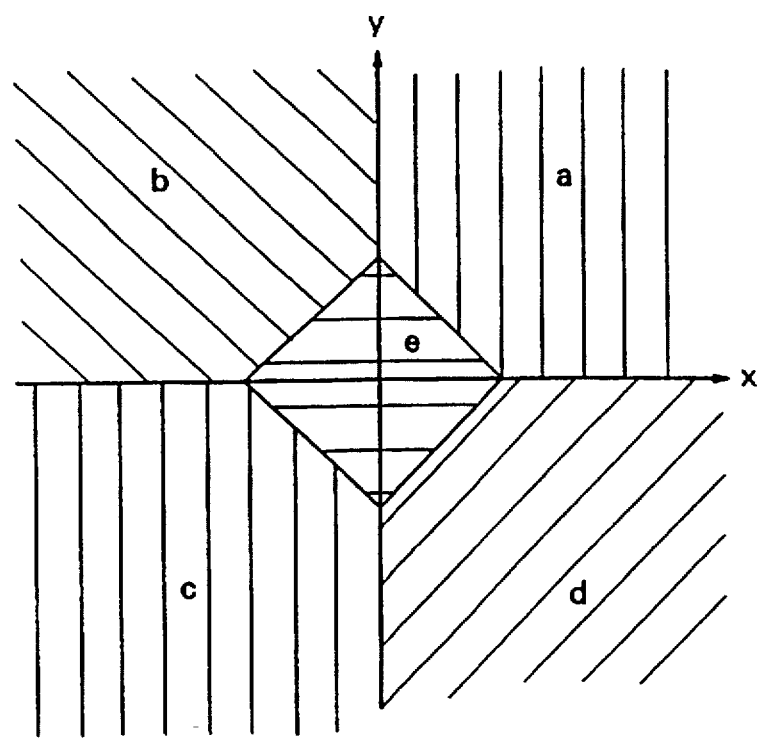
FIG. 15 is a schematic diagram for explaining an output of an encoder shown in FIG. 14.
FIG. 16 is a table for explaining an output of a vector decoder shown in FIG. 14.

FIG. 14 is a block diagram showing the construction of the vector delta sigma modulator 43 for use in the amplitude and phase modulator shown in FIG. 12. An encoder 45 outputs a code according to coordinates (x, y) represented by two scalar inputs thereof which are contained in regions a, b, c, d, and e on the coordinate plane of FIG. 15. The output of the encoder 45 is output as an output signal (selection signal) of the vector delta sigma modulator 43. In addition, the output of the encoder 45 is input to a vector decoder 46. The vector decoder 46 outputs the coordinates on the phase plane of the output of the selector 44. The coordinates of each point on the phase plane shown in FIG. 13 can be represented by a table shown in FIG. 16. This table represents the relation between the input and output of the vector decoder 46.

The relation between the input and output of a linear transformer 47 can be generally represented by the following formula.

$$\begin{pmatrix} x \\ y \end{pmatrix} = \begin{pmatrix} F11(Z^{-1}) & F12(Z^{-1}) & F13(Z^{-1}) & F14(Z^{-1}) \\ F21(Z^{-1}) & F22(Z^{-1}) & F23(Z^{-1}) & F24(Z^{-1}) \end{pmatrix} \begin{pmatrix} I \\ Q \\ Ir \\ Qr \end{pmatrix}$$ (formula 1)

When each element of transformation matrix is given as follows, an amplitude and phase modulation wave similar to those of the third to sixth embodiments can be obtained.

$$F11(Z^{-1}) = F22(Z^{-1}) = -F13(Z^{-1}) = -F24(Z^{-1}) = \frac{1}{1 - Z_{-1}}$$ (formula 2)

$$F21(Z^{-1}) = F12(Z^{-1}) = -F23(Z^{-1}) = -F14(Z^{-1}) = 0$$

However, in the case of the third to sixth embodiments, the output of signal e equivalent to the origin of the phase plane cannot be selected. Thus, according to the seventh embodiment which can select the output of signal e, the amount of quantization noise can be decreased.

In addition, according to the third to sixth embodiments, the frequency characteristic of quantization noise is symmetrical to the carrier frequency. However, since the vector delta sigma modulator has the characteristics of a linear converter, frequency characteristics which are asymmetrical to the carrier frequency can be obtained.

Figure 17:
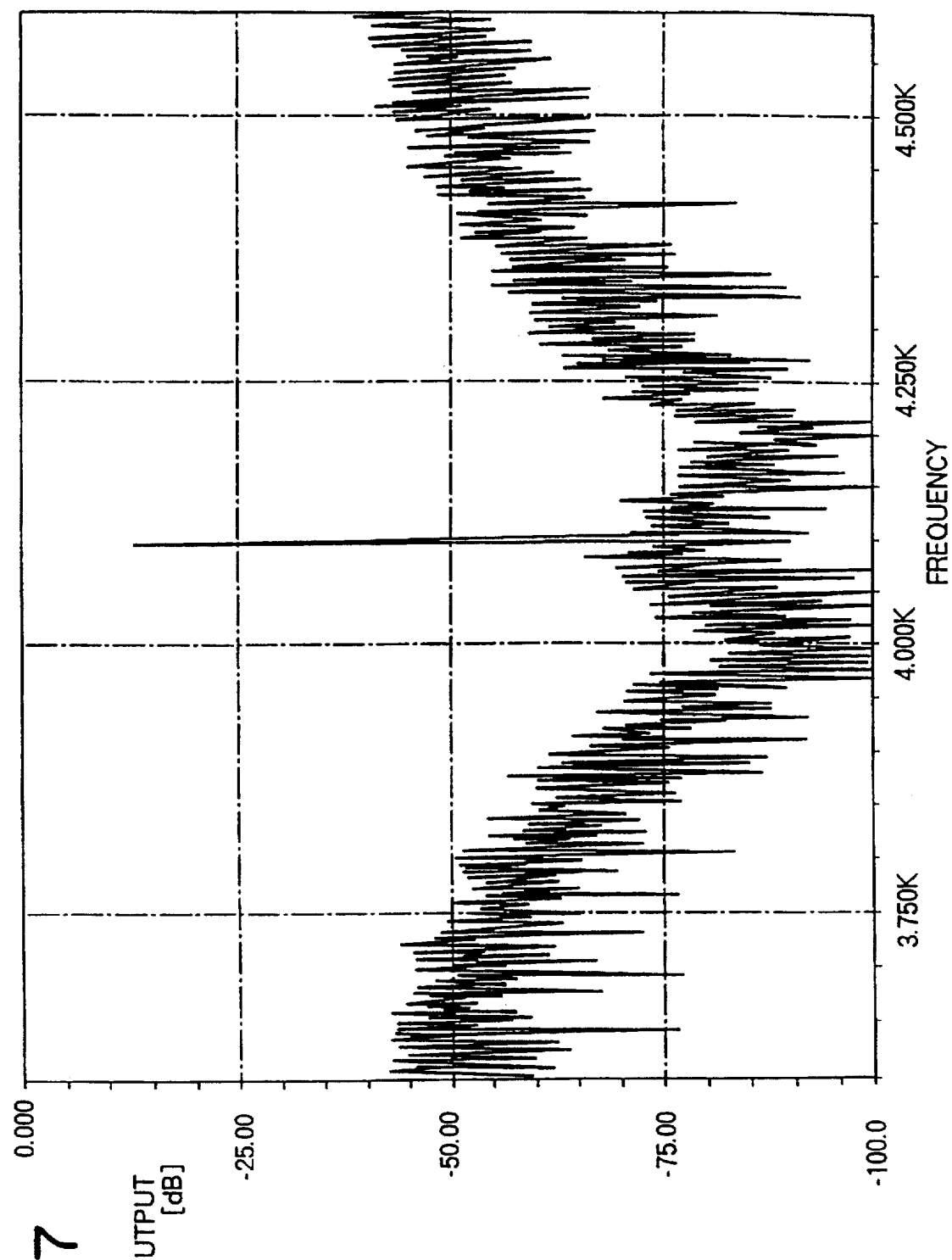
FIG. 17 is graph showing a spectrum of an output signal of the amplitude and phase modulator of the fifth embodiment according to the present invention, the spectrum being obtained by a computer simulation.

FIG. 17 is graph showing a spectrum of an output signal of the amplitude and phase modulator of the fifth embodiment according to the present invention. This spectrum was obtained by a computer simulation. By mixing a carrier frequency of 4096 Hz with a modulation frequency of 4 Hz, a signal with a frequency of 4100 Hz is output. The delta sigma modulators 30 and 31 each have a secondary loop filter whose pole is present at 100 Hz. Since this filter only permits real coefficients, the pole should be present on the real axis. Otherwise, poles which have the relation of a complex conjugate should be present. On the spectrum of quantization noise, there are minimum points at carrier frequency ±100 Hz, namely 3996 Hz and 4192 Hz.

Figure 18:
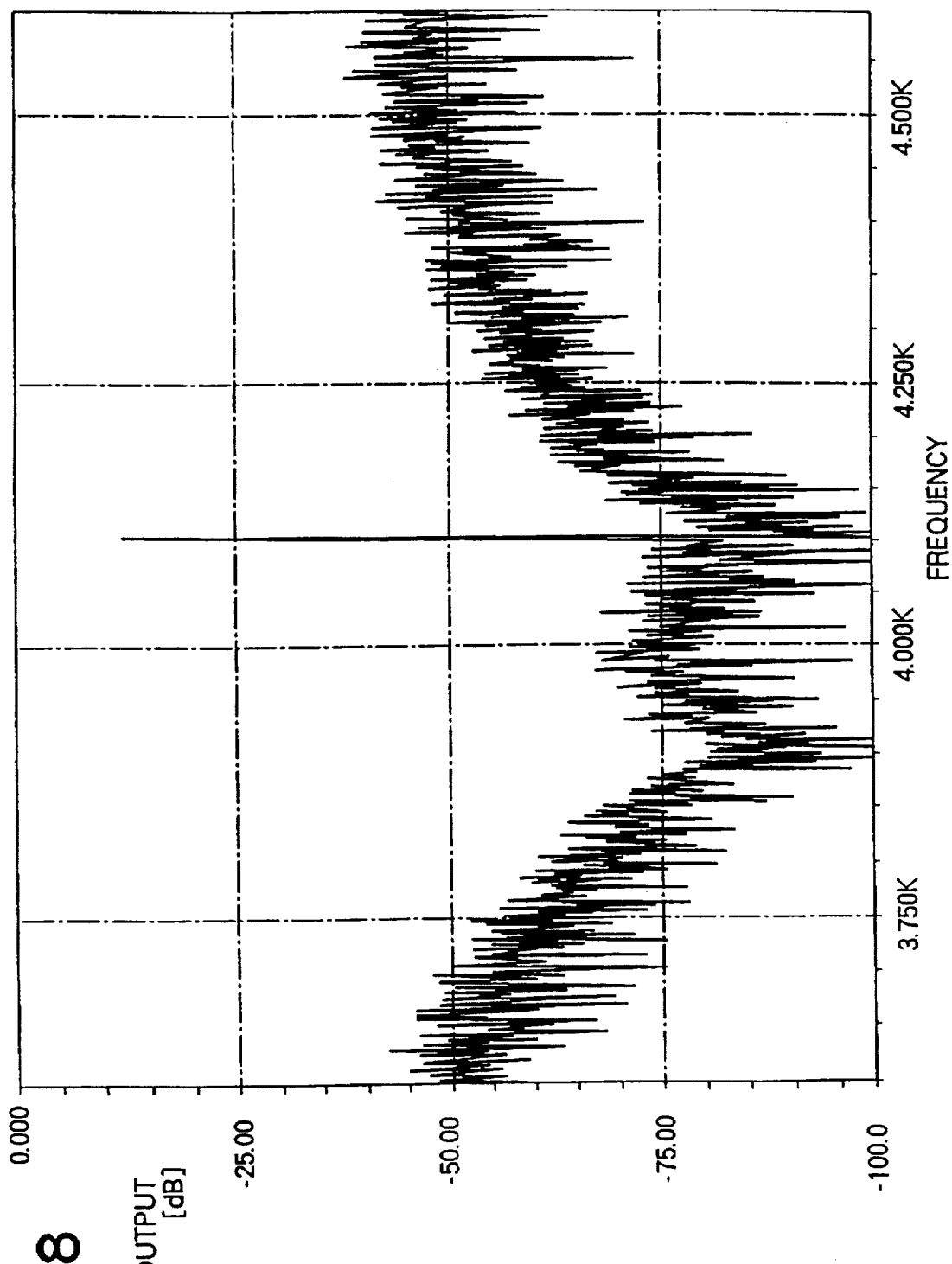
FIG. 18 is a graph showing a spectrum of an output signal of the amplitude and phase modulator of the seventh embodiment, the spectrum being obtained by a computer simulation.

FIG. 18 is a graph showing a spectrum of an output signal of the amplitude and phase modulator of the seventh embodiment. The spectrum was obtained by a computer simulation. The carrier frequency and the modulation signal of the seventh embodiment are similar to those of the fifth embodiment. However, in the seventh embodiment, the vector delta sigma modulator is used. Thus, the liner converter 47 can form a complex coefficient filter. With the complex coefficient filter, the position of an pole can be designated without the relation of complex conjugate. In this example, poles are positioned at 10 Hz and −200 Hz. As a result, there are minimum points of quantization noise at 3896 Hz and 4106 Hz.

Figure 19:
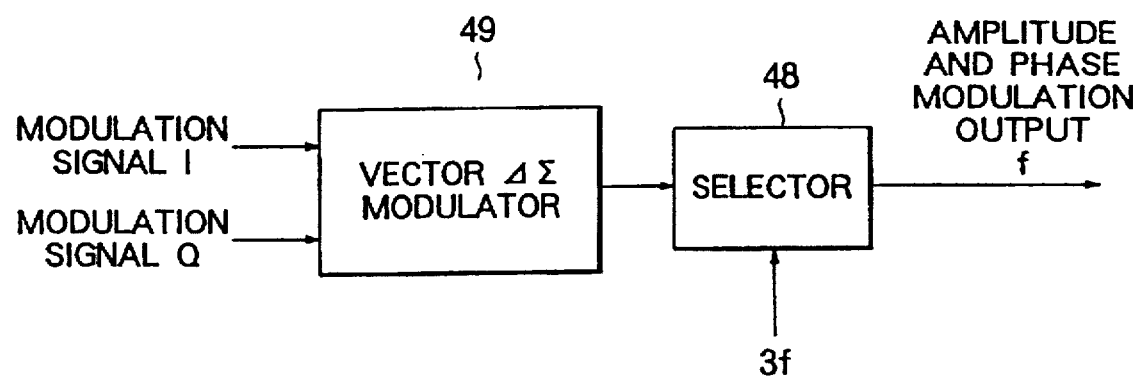
FIG. 19 is a block diagram showing the construction of an amplitude and phase modulator of an eighth embodiment according to the present invention.

FIG. 19 is a block diagram showing the construction of an amplitude and phase modulator of an eighth embodiment according to the present invention. A reference signal is sent to a selector 48. The frequency of the reference signal is three times higher than that of a required output signal. By dividing the frequency of this signal by 3, signals with phases which differ by 120° can be generated.

Figure 20:
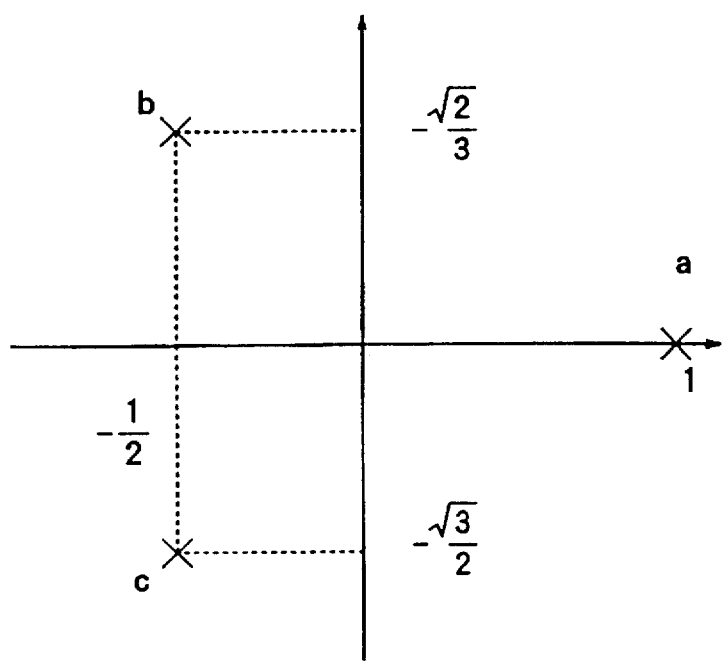
FIG. 20 is a schematic diagram for explaining an output of a selector shown in FIG. 19.

Modulation signals I and Q are sent to a vector delta sigma modulation circuit 49. The circuit 49 converts the signals I and Q into a sequence of three selection signals a, b, and c. When the selection signals a, b, and c are sent to the selector 48, it outputs signals according to points represented by a, b, and c on a phase plane shown in FIG. 20. In this example, since the selector 48 handles only signals with the same amplitude, it can be constructed of a switching circuit.

Figure 21:
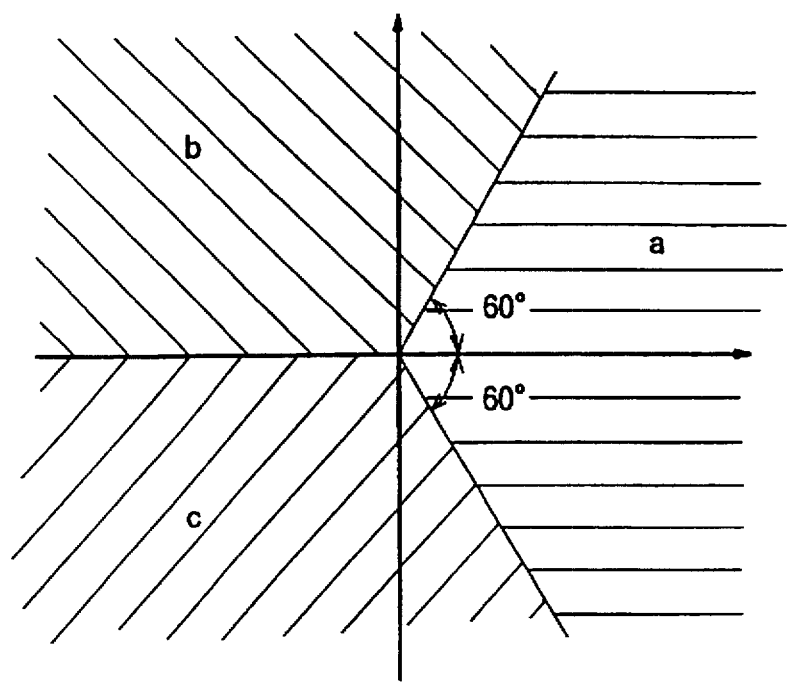
FIG. 21 is a schematic diagram for explaining an output of an encoder of the eighth embodiment.
Figures 22, 23:
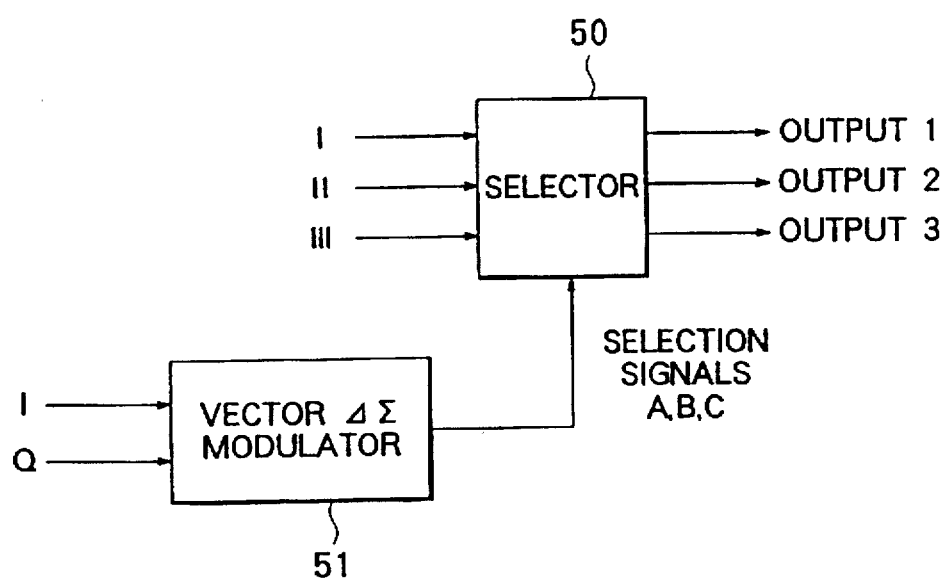
FIG. 22 is a table showing the relation between input and output of a vector decoder of the eighth embodiment.
FIG. 23 is a schematic diagram for explaining a ninth embodiment according to the present invention.

The construction of the vector delta sigma modulator 49 shown in FIG. 19 is similar to that of the modulator shown in FIG. 14. However, the encoder 45 outputs a code according to coordinates represented by two scalar inputs contained in regions a, b, and c on a coordinate plane shown in FIG. 21. FIG. 22 shows the relation between the input and output of the vector decoder 46. The relation between the input and output of the linear converter 47 can be represented by the formula 1. When each element of the transformation matrix is given by the formula 2, an amplitude and phase modulation wave can be obtained, which is similar to that obtained by two sets of conventional sigma delta converters. In this example, since there are only three output points, the amount of quantization noise increases. However, in this example, with a frequency three times higher than that of the desired wave rather than four times, a modulation signal can be accurately obtained.

FIG. 23 is a schematic diagram for explaining a ninth embodiment according to the present invention. In this embodiment, the present invention is applied to an inverter which is mainly used for controlling electric power. This inverter is mathematically the same as a modulator.

Figure 24:
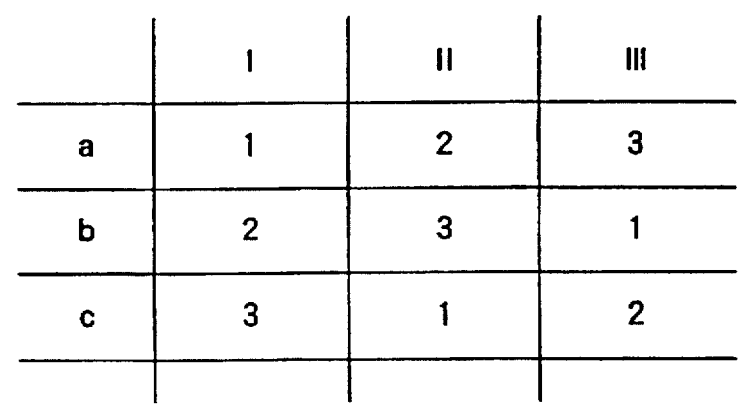

Three-phase AC is supplied to a selector 50. A vector delta sigma modulator 51 outputs three selection signals a, b, and c. When the selection signal a is sent to the selector 50, as shown in FIG. 24, inputs I, II, and III are connected to outputs 1, 2, and 3, respectively. When the selection signal b is sent to the selector 50, the inputs I, II, and III are connected to the outputs 2, 3, and 1, respectively. When the selection signal c is sent to the selector 50, the inputs I, II, and III are connected to the outputs 3, 1, and 2, respectively.

Now, consider an example where a power with a frequency of 60 Hz is input and this frequency is converted into 50 Hz.

In this example, sine signals with a frequency of 10 Hz and phases which differ by 90° each other are sent to a vector delta sigma modulator 51.

The construction of the vector delta sigma converter 51 is similar to that of the eighth embodiment. The output frequency is lower than the input frequency of 60 Hz by 10 Hz. Thus, a minimum point of the quantization noise can be placed at only 50 Hz rather than 70 Hz.

Figure 25:
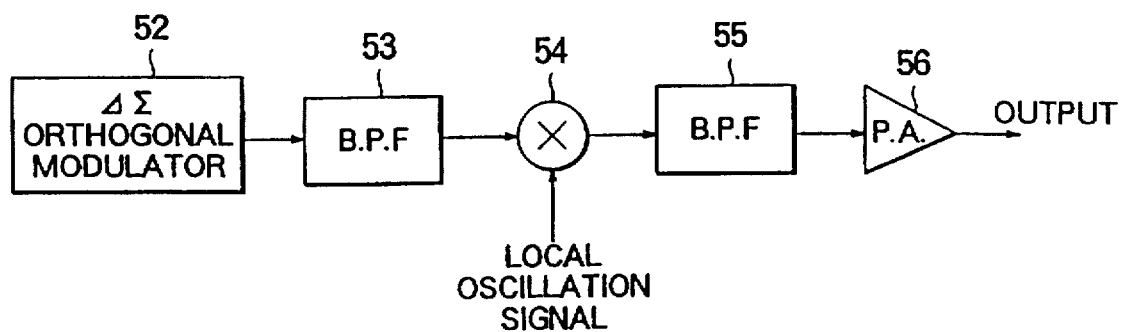
FIG. 25 is a block diagram showing the construction of a transmitter using a delta sigma orthogonal modulator of the embodiment.

FIG. 25 is a block diagram showing the construction of a transmitter using the delta sigma orthogonal modulator of the embodiment.

As shown in the figure, a band-pass filter 53 removes signals which are out of a desired frequency band from output signals of a delta sigma orthogonal modulator 52. The resultant signal is sent to a mixer 54. The mixer 54 mixes the output signal of the band-pass filter 53 and a local oscillation signal. The mixed signal is sent to a band-pass filter 55. The band-pass filter 55 outputs a signal with a desired frequency. This signal is sent to a linear amplifier 56. The linear amplifier 56 amplifies the power of the input signal and outputs the amplified signal.

Figure 26:
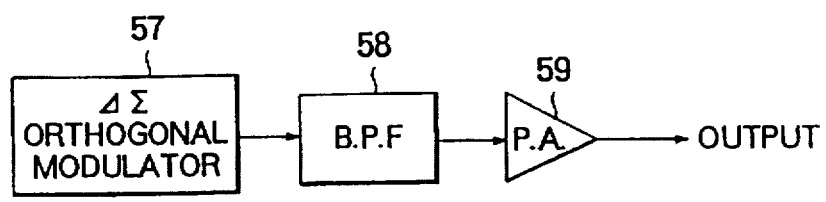
FIG. 26 is a block diagram showing the construction of another transmitter using the delta sigma orthogonal modulator of the embodiment.

FIG. 26 is a block diagram showing the construction of another transmitter using the delta sigma orthogonal modulator of the embodiment.

As shown in the figure, a band-pass filter 58 removes signals which are out of a desired frequency band from output signals of a delta sigma orthogonal modulator 57. The resultant signal is sent to a linear amplifier 59. The linear amplifier 59 amplifies the power of the input signal and outputs the amplified signal.

Figure 27:
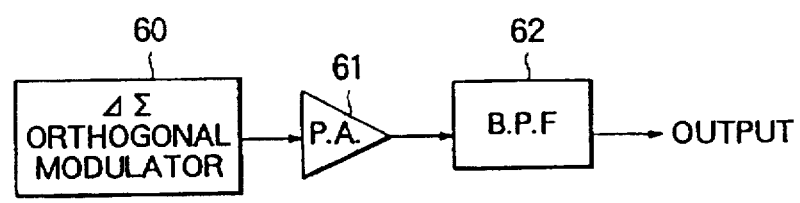
FIG. 27 is a block diagram showing the construction of a further other transmitter using the delta sigma orthogonal modulator of the embodiment.
Figure 30:
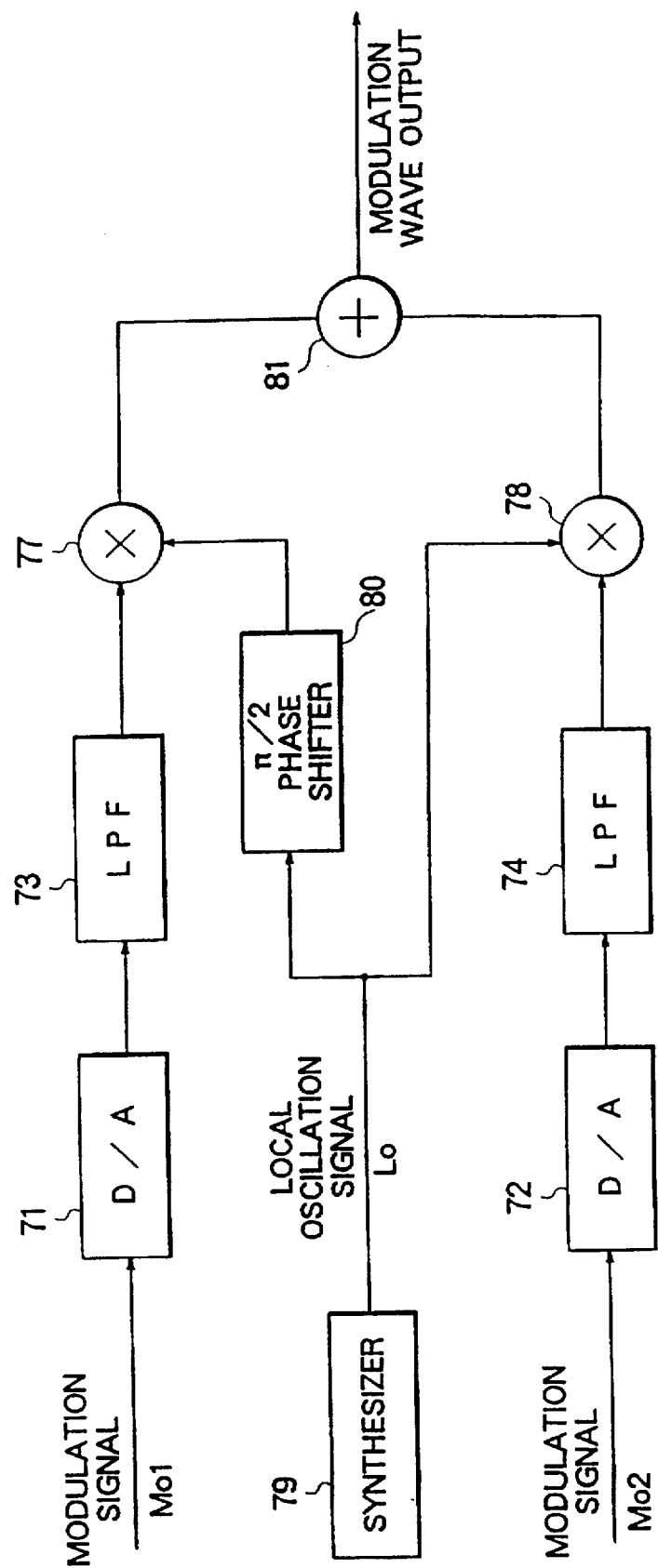
FIG. 30 is a block diagram showing the construction of an example of a conventional orthogonal modulator.

FIG. 27 is a block diagram showing the construction of a further other transmitter using the delta sigma orthogonal modulator of the embodiment.

As shown in the figure, an output signal of a delta sigma orthogonal modulator 60 is nonlinear-amplified by a nonlinear amplifier 61. Since the amplitude of the output signal of the delta sigma orthogonal modulator 60 is constant, the nonlinear amplifier 61 should have a high efficiency. When the output signal of the delta sigma orthogonal modulator 60 is nonlinear- amplified by the nonlinear amplifier 61, the resultant signal is sent to a band-pass filter 62. The band-pass filter 62 selects only a desired frequency band and outputs the resultant signal. In radio transmitters, in particular mobile communication, the output power should be controlled. In the conventional transmitters, the output power is controlled by using a variable gain amplifier or a variable attenuator. However, in the system using a switching amplifier as an output means, one of different control systems should be used. Since the amplitude and phase modulation system is used, a method where the amplitude of a modulation signal is decreased can be used. In addition, by thinning out an input signal (output of the selector) according to the output power as shown in FIG. 28, the output can be also controlled. In other words, FIG. 28($b$) shows the output of the selector in the full power state. By causing the selector to output the signal for the half period as shown in FIG. 28($b$), the output power can be halved. By causing the selector to output the signal for the quarter period as shown in FIG. 28($c$), the output power can be quartered. FIG. 29 is a conceptual schematic diagram showing a class D amplifier. The output of this amplifier is almost proportional to power supply voltage VDD. Thus, when the power supply voltage VDD is controlled by a high efficient voltage control circuit such as a switching regulator, even if the output power is low, the efficiency of the amplifier is high.

As described above, according to the present invention, a modulator with high accuracy provided by a digital circuit can be accomplished using a power consumption equal to or lower than that of an analog circuit.

In addition, the modulator according to the present invention is basically constructed of a switching circuit (logical circuit). Thus, the modulator is suitable for a microcomputer. Moreover, since the modulator does not require an interface circuit or can use a simple interface for forming a control system.

Furthermore, by using a vector sigma delta modulation, the degree of freedom of the frequency characteristics with respect to quantization noise increases. Thus, the clock frequency can be lowered and thereby the power consumption can be further decreased.

Thus, by using to the modulator according to the present invention, the size of the radio transmitter can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

The amplitude and phase modulation is often used to send digital signals. In particular, as in QPSK modulation system, if a limited number of input signals are modulated, a simulation result of delta sigma modulation is pre-stored in a memory and it is read corresponding to a modulation input.

Figure 31:
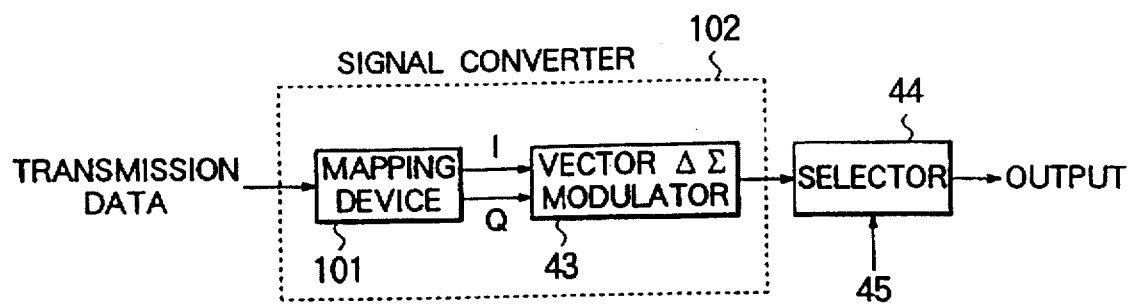
FIG. 31 is a block diagram showing the construction of the amplitude and phase modulator shown in FIG. 12.

In other words, in the QPSK modulation, as shown in FIG. 31, a mapping device 101 is disposed upstream of the vector delta sigma modulator 43 shown in FIG. 12 or 14. The signal converter 102 is constructed of the vector delta sigma modulator 43 and the mapping device 101. The mapping device 101 of the signal converter 102 converts input transmission data into coordinates on the phase plane, generates modulation signals I and Q, and sends these signals to the vector delta sigma converter 43. The vector delta sigma converter 43 converts the input modulation signals I and Q into a selection signal. The selection signal is sent to the selector 44. Both the vector delta sigma modulator 43 and the mapping device 101, which construct the signal converter 102, are means that convert input signal into discrete time basis signal. The transmission data is a sequence of digital signals composed of several bits that constructs the selection signal. Thus, as described above, the signal converter 102 constructed of the vector delta sigma modulator 43 and the mapping device 101 can be substituted with a signal converting means using a memory.

Figure 32:
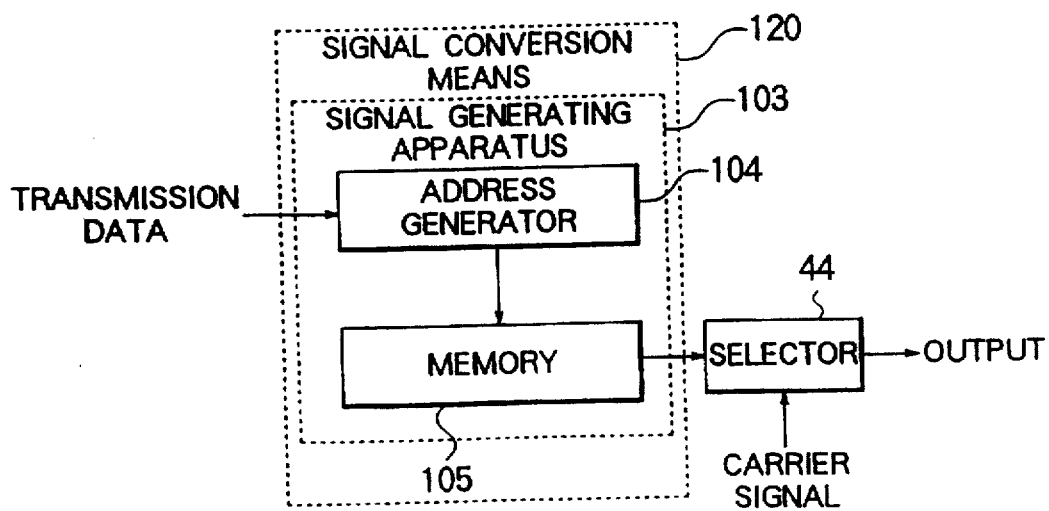
FIG. 32 is a block diagram showing a memory that constructs the signal converter of the amplitude and phase modulator shown in FIG. 31.

FIG. 32 is a block diagram showing the signal converting means shown in FIG. 31. The signal converting means 120 is constructed of a memory. As shown in FIG. 32, the signal generating apparatus 103 accords with the signal converter 102 shown in FIG. 31. The signal generating apparatus 103 is constructed of an address generator 104 and a memory 105. The address generator 104 converts the transmission data into a predetermined memory address of the memory 105. The memory 105 outputs data corresponding to the designated memory address. The output data of the memory 105 accords with the output data of the vector delta sigma modulator 43 shown in FIG. 31.

However, to obtain the output signal that is less affected by quantizing noise, it is necessary to raise the sampling frequency. Thus, when such a memory is used, the data amount of the simulation result stored therein becomes large.

Figure 33:
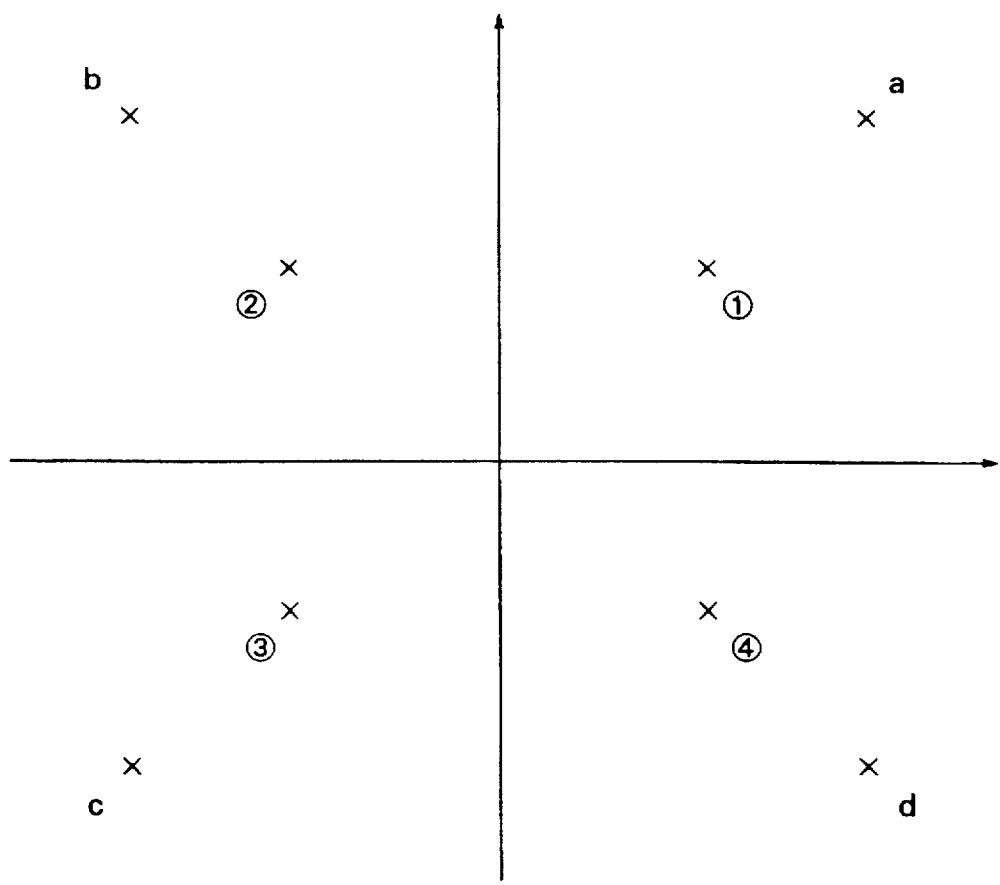
FIG. 33 is a schematic diagram showing a signal constellation of an amplitude and phase modulator according to a tenth embodiment of the present invention.

As shown in FIG. 33, now assume that the modulator generates a QPSK signal with signal points (1), (2), (3), and (4). In FIG. 33, reference letters a, b, c, and d are a signal sequence that is output from the vector delta sigma modulator 43. The position (r, $^\theta$) of coordinates of each of signals a, b, c, and d represents the amplitude and phase of pulses that are output from the selector 44.

Figure 34:
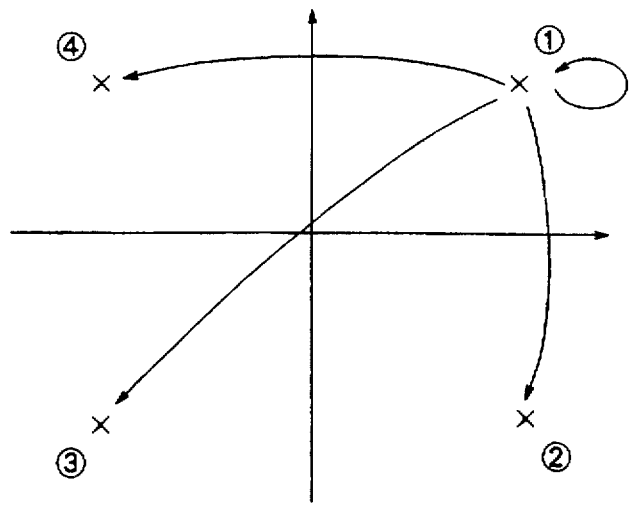
FIG. 34 is a schematic diagram for explaining a phase transition according to the tenth embodiment.

Now assume that a code corresponding to the signal point (1) is output on the phase plane. Since the next code is a code corresponding to the signal points (1), (2), (3), and (4), the phase transition can be represented as shown in FIG. 34.

When a code corresponding to the signal point (1) is followed by a code corresponding to the signal point (4), the phase transition takes place along an arrow line that travels from the signal point (1) to the signal point (4). The vector delta sigma modulator 43 represents the phase transition corresponding to the ratio of the amounts of the signals a, b, c, and d. For example, on the phase plane, it is assumed that the amounts of signals a, b, c, and d are 80, 50, 20, and 50, respectively. The ratio of the amounts of a, b, c, and d is varied along the arrow line that travels from the signal point (1) to the signal point (4). For example, when the amounts of signals a, b, c, and d become 50, 80, 50, and 20, respectively, the signal point (4) on the phase plane is represented. When the simulation result is stored in the memory, a signal sequence that is output from the vector delta sigma modulator 43 is stored in the memory while the phase transition takes place from the signal point (1) to the signal point (4).

Figure 35:
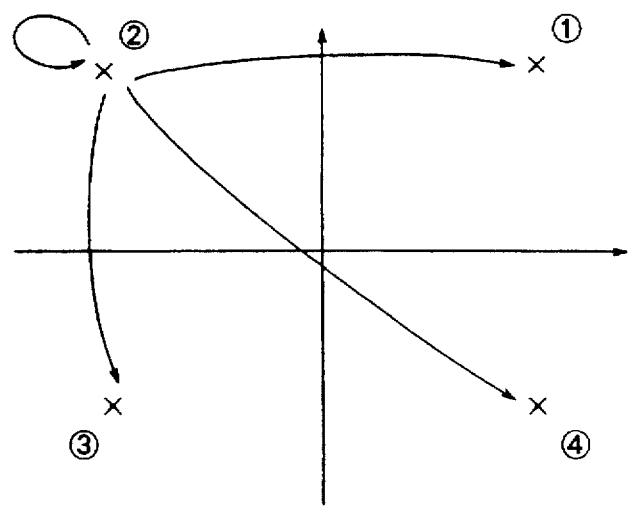
FIG. 35 is another schematic diagram for explaining a phase transition according to the tenth embodiment.

In the above-described example, it was supposed that a code corresponding to the signal point (1) was followed by a code corresponding to the signal point (4). However, in reality, as shown in FIG. 34, a code corresponding to the signal point (1) is followed by a code corresponding to the signal point (1); a code corresponding to the signal point (1) is followed by a code corresponding to the signal point (2); a code corresponding to the signal point (1) is followed by a code corresponding to the signal point (3). In addition, as shown in FIG. 35, a code corresponding to the signal point (2) is followed by a code corresponding to the signal point (1); a code corresponding to the signal point (2) is followed by a code corresponding to the signal point (2); and so forth. Moreover, a code corresponding to the signal point (3) is followed by a code corresponding to the signal point (1); a code corresponding to the signal point (4) is followed by a code corresponding to the signal point (1); and so forth (not shown). However, in the radio communication, to narrow the occupied band-width, the band-width of the modulation signals are often limited. When the band-width is limited, the path between each code on the phase plane is affected by adjacent codes. Thus, when the phase transition takes place from a code corresponding to the signal point (1) to a code corresponding to the signal point (4), the phase transition is affected depending on a code preceding the code corresponding to the signal point (1). For example, the phase transition (phase) that takes place from a code corresponding to the signal point (1) to a code corresponding to the signal point (4) depends on whether a code corresponding to the signal point (1) is preceded by a code corresponding to the signal point (2) or (3).

Thus, it is clear that the simulation result of the delta sigma modulation is vary large amount of data. Consequently, when the simulation result is stored in the memory and read corresponding to the modulation input, a memory with a large storage capacity is required.

As a result, the amplitude and phase modulator corresponding to the delta sigma modulation shown in FIG. 12 or 14 can reduce the power consumption and portions to be adjusted. However, in the amplitude and phase modulator, in which the simulation result is pre-stored in a memory and read therefrom corresponding to the modulation input, the data amount of the simulation result to be pre-stored becomes large and thereby the memory requires a large storage capacity.

Next, a delta-sigma-modulation type amplitude and phase modulator that stores simulation result of delta sigma modulation in a memory and reads the simulation result therefrom corresponding to modulation input will be described as a tenth embodiment of the present invention. Since the data amount of the simulation result to be pre-stored in the memory is reduced, the memory does not require a large storage capacity.

Figure 36:
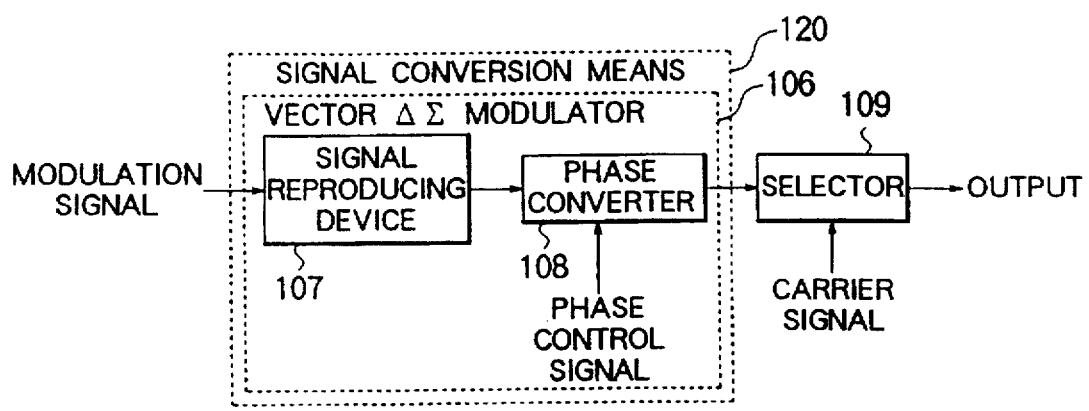
FIG. 36 is a block diagram showing the construction of the amplitude and phase modulator according to the ten embodiment of the present invention.

FIG. 36 is a block diagram showing the construction of the amplitude and phase modulator according to the tenth embodiment of the present invention. Referring to FIG. 36, the signal conversion means 120 comprises a vector delta sigma modulator 106 that is constructed of a signal reproducing device 107 and a phase converter 108. The construction of the vector delta sigma modulator 106 is different from the construction of the vector delta sigma modulator 43 shown in FIG. 12. However, the selection signal corresponding to the modulation signals I and Q shown in FIG. 36 is the same as that shown in FIG. 12. In FIG. 36, reference numeral 109 is a selector that has the same construction as that of the selector 44 shown in FIG. 12.

Next, the relation between the amplitude and phase modulator according to the tenth embodiment of the present invention and the amplitude and phase modulator shown in FIG. 31 will be described.

Figure 37:
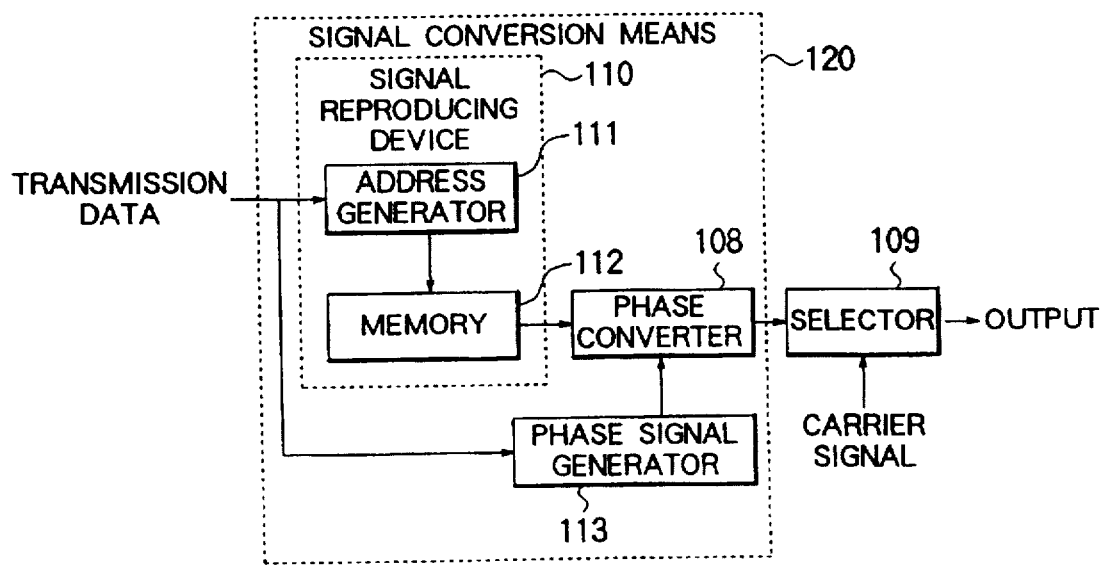
FIG. 37 is a detailed block diagram showing the construction of the amplitude and phase modulator shown in FIG. 36.

FIG. 37 is a block diagram showing the construction of the amplitude and phase modulator according to the tenth embodiment of the present invention.

The signal conversion means 120 comprises a phase converter 108, a signal reproducing device 110, and a phase signal generator 113. The phase converter 108, the signal reproducing device 110, and the phase signal generator 113 shown in FIG. 37 accords with the signal converter 103 shown in FIG. 32. The signal reproducing device 110 is constructed of an address generator 111 and a memory 112. Transmission data is input to the address generator 111 and the phase signal generator 113 of the signal reproducing device 110.

The address generator 111 converts the transmission data to a memory address signal corresponding thereto. In addition, the address generator 111 converts the transmission data into a phase control signal corresponding thereto. In the amplitude and phase modulator shown in FIG. 32, a memory 105 pre-stores output data for each transmission data. An address generator 104 generates an address corresponding to the transmission data. On the other hand, in the amplitude and phase modulator shown in FIG. 37, a memory 112 treats data that are symmetrical on the phase plane as the same data and pre-stores these data as one output data. The address generator 111 generates an address corresponding to the input transmission signal. However, the address generator 111 treats addresses of output data that are symmetrical on the phase planes as the same address. The phase signal generator 113 generates a phase control signal corresponding to the phase on the phase plane of a signal sequence that is input to the selector 109. In other words, output data that are symmetrically on the phase plane are sent from the memory 112 to the phase converter 108. When the output data are rotated on the phase plane, different phase control signals corresponding to the phases thereof are supplied from the phase signal generator 113 to the phase converter 108. Thus, the same sequence as the input signal sequence that is supplied from the signal converter 103 to the selector 44 are input to the selector 109.

Next, this embodiment will be described in detail. In this description, it is assumed that the amplitude and phase modulator shown in FIG. 37 generates a QPSK signal with signal points (1), (2), (3), and (4). In FIG. 33, reference letters a, b, c, and d are a signal sequence that is output from the phase converter 108. The position (r, $^\theta$) on the coordinates of each of the signal points a, b, c, and d represents the amplitude and phase of pulses that are output from the selector 109.

Now, it is assumed that a code corresponding to the signal point (1) on the phase plane is output. Since the next code is a code corresponding to one of the signal points (1), (2), (3), and (4), the phase transition can be represented as shown in FIG. 35. When the phase planes of FIGS. 34 and 35 are compared, it is clear that when the phase plane of FIG. 34 is rotated clockwise for 90 deg, the rotated phase plane accords with the phase plane shown in FIG. 35.

The memory 112 pre-stores vector delta sigma conversion results from the signal point (1) to the next signal points (1), (2), (3), and (4).

As shown in FIG. 38, the phase converter 108 converts each of input signals a, b, c, and d that are supplied from the memory 112 into one of signals a, b, c, and d corresponding to the phase control signal received from the phase signal generator 113. In this embodiment, when the amplitude and phase modulator outputs a code corresponding to the signal point (1) on the phase plane, the phase control signal is P1. When the amplitude and phase modulator outputs a code corresponding to the signal point (2) on the phase plane, the phase control signal is P2. When the amplitude and phase modulator outputs a code corresponding to the signal point (3) on the phase plane, the phase control signal is P3. When the amplitude and phase modulator outputs a code corresponding to the signal point (4) on the phase plane, the phase control signal is P4.

When transmission data is input to the signal reproducing device 24 in such a manner a code is moved from the signal point (1) to the signal point (2), namely in the counterclockwise direction on the phase plane, the signal reproducing device 110 outputs a signal sequence a, b, c, and d that is equivalent to the path from the signal point (1) to the signal point (2) on the phase plane. The signal sequence is input to the phase converter 108.

Since the current phase control signal is P1, the phase converter 108 outputs the signal sequence that is supplied from the signal reproducing device 110 directly to the selector 109.

After the signal sequence that moves from the signal point (1) to the signal point (2) has been reproduced, the phase control signal is changed to P2.

When transmission data is input to the signal reproducing device 110 in such a manner that a code corresponding to the signal point (2) is changed to a code corresponding to the signal point (3), namely in the counterclockwise direction on the phase plane, the signal reproducing device 110 outputs a signal sequence a, b, c, and d that is equivalent to the path from the signal point (1) to the signal point (2) on the phase plane. The signal sequence is input to the phase converter 108.

Since the phase control signal that is supplied from the phase signal generator 113 to the phase converter 108 is P2, the signal reproducing device 110 converts the signal sequence a, b, c, and d into a signal sequence b, c, d, and a.

Thus, the output of the selector 109 has the path from the signal point (2) to the signal point (3).

Thus, according to the amplitude and phase modulator of this embodiment, only the results of vector delta sigma conversion from the signal point (1) to the signal points (1), (2), (3), and (4) are pre-stored. Thus, it is not necessary to pre-store the results of the vector delta sigma conversion from the signal points (2), (3), and (4) to the next signal points (1), (2), (3), and (4). Consequently, the storage capacity of the memory can be remarkably reduced.

In addition, the amplitude and phase modulator according to the present invention is especially advantageous in the case of the differential encoding system. In other words, when the differential-encoding type QPSK modulating system is used for a conventional analog modulator, since the phase transitions of codes on the phase plane (namely, counterclockwise phase transition, clockwise phase transition, diagonal phase transition, and no phase transition) are defined, a differential encoder is required. On the other hand, according to the amplitude and phase modulator of the present invention, the effect of the differential encoding system can be accomplished by the phase converter 108.

When the relation of input and output of the phase converter 108 is defined as shown in FIG. 39, if the phase control signal is P5, the output of the signal sequence with the phase transition from the signal point (1) to the signal point (2) can be converted into the signal sequences with the phase transition from the signal point (1) to the signal point (4). Thus, the paths with the mirror relation can be formed of common data.

Figure 40:
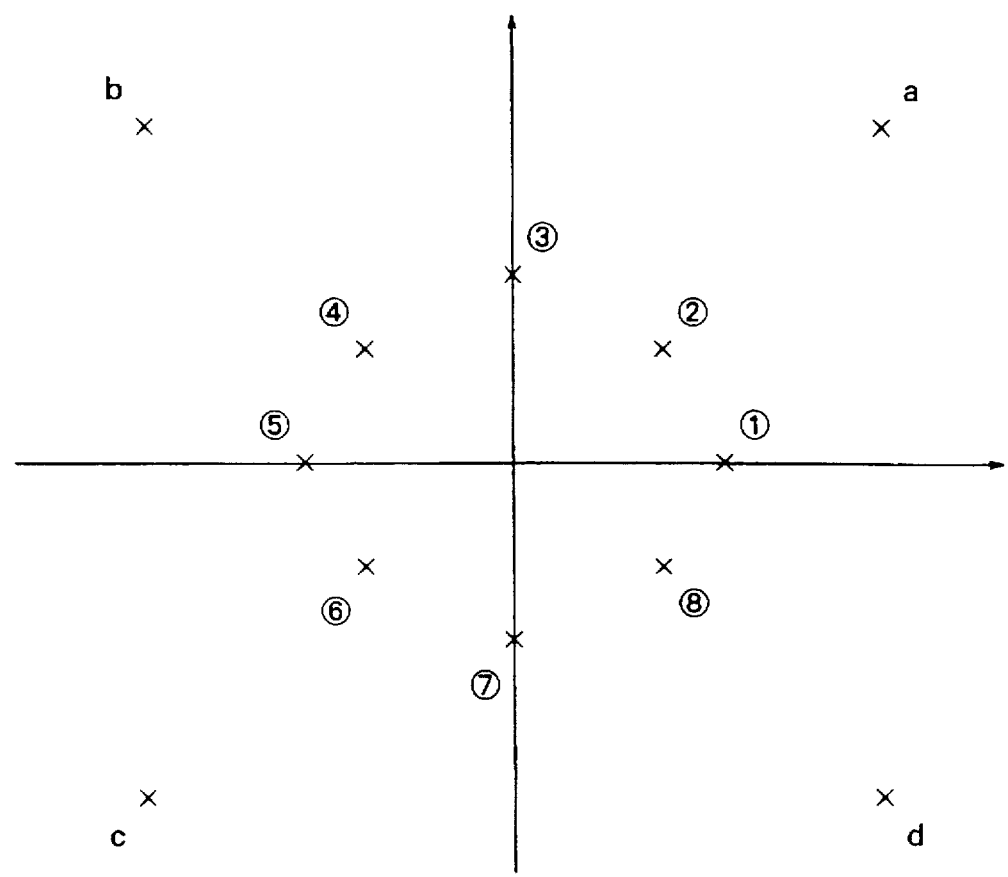
FIG. 40 is a schematic diagram showing a signal constellation of an amplitude and phase modulator according to an eleventh embodiment of the present invention.

FIG. 40 is a schematic diagram for explaining an eleventh embodiment of the present invention.

In FIG. 40, a signal constellation of an eight-phase PSK modulator is shown. The construction of the amplitude and phase modulator of this embodiment is the same as that shown in FIG. 37. However, the signal reproducing device 110 should pre-store eight-phase QPSK signals. The phase converter 108 pre-stores a code sequence that moves from the signal point (1) to each signal point and another code sequence that moves from the signal point (2) to each signal point. When the first signal point number is an odd number, data at the signal point (1) is used. When the first signal point number is an even number, data at the signal point (2) is used.

Thus, as with the ten embodiment, in the eleventh embodiment, when the relation of input and output of the phase converter 108 is defined as shown in FIG. 39, data can be converted in a mirror relation. For example, when a signal sequence that moves from the signal point (2) to the signal point (3) is converted corresponding to the phase control signal P5, a signal sequence that moves from the signal point (2) to the signal point (1) takes place. When a signal sequence that moves from the signal point (1) to the signal sequence (2) is converted corresponding to the phase control signal P8, a signal sequence that moves from the signal point (1) to the signal point (8) takes place. Thus, data to be pre-stored in the signal reproducing device 110 is only data that moves from the signal point (1) to each of the signal points (1) to (5) and data that moves from the signal point (2) to each of the signal points (1) to (5).

The signal constellation of the eight-phase PSK system is the same as that of a π/4 shift QPSK system. However, in the case of the π/4 shift QPSK, data from any odd number signal point shown in FIG. 40 to any even number signal point is omitted.

Figure 41:
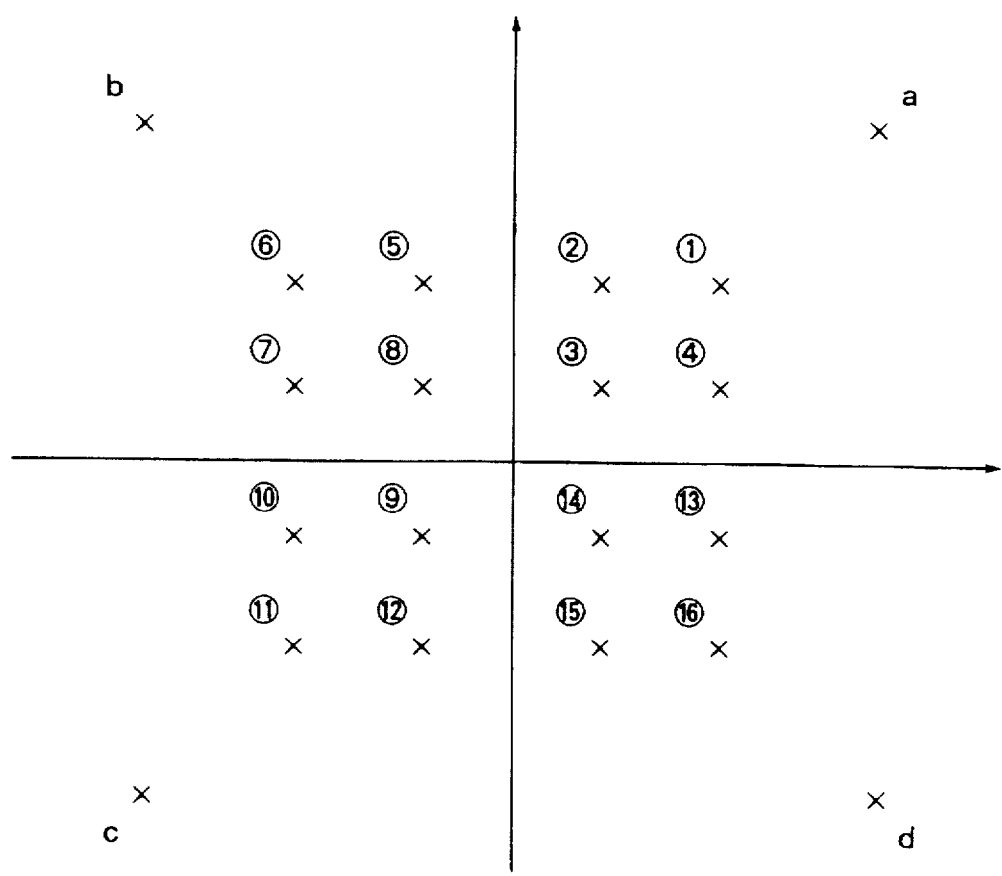
FIG. 41 is a schematic diagram showing a signal constellation of an amplitude and phase modulator according to a twelfth embodiment of the present invention.

FIG. 41 is a schematic diagram for explaining a twelfth embodiment of the present invention.

FIG. 41 shows a signal constellation of a 16-QAM modulator. The amplitude and phase modulator of this embodiment is applied to the signal constellation shown in FIG. 41. The construction of the amplitude and phase modulator according to the twelfth embodiment is the same as that shown in FIG. 37. However, the signal reproducing device 110 should pre-store 16-QAM signals. In this case, a modulation signal is formed of data from each of the signal points (1), (2), and (3) to each signal point that are converted corresponding to the definition of FIG. 38.

Figure 42:
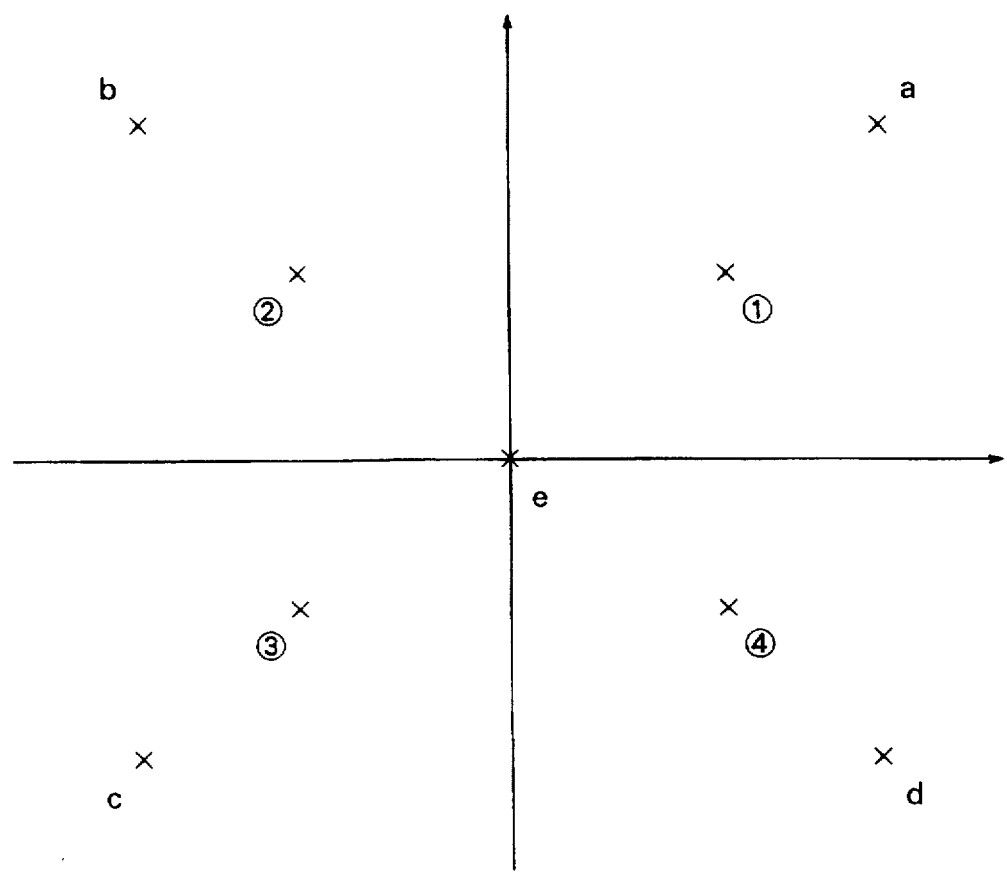
FIG. 42 is a schematic diagram showing a signal constellation of an amplitude and phase modulator according to a thirteenth embodiment of the present invention.

FIG. 42 is a schematic diagram for explaining a thirteenth embodiment of the present invention.

FIG. 42 shows the signal constellation of a QPSK modulator. The amplitude and phase modulator according to this embodiment is applied to the signal constellation. In this embodiment, the selector 109 selects one of five signals that are four signals whose phases differ by 90 deg each other and a signal with no amplitude. FIG. 43 shows the relation of input and output of the phase converter 108.

Figure 44:
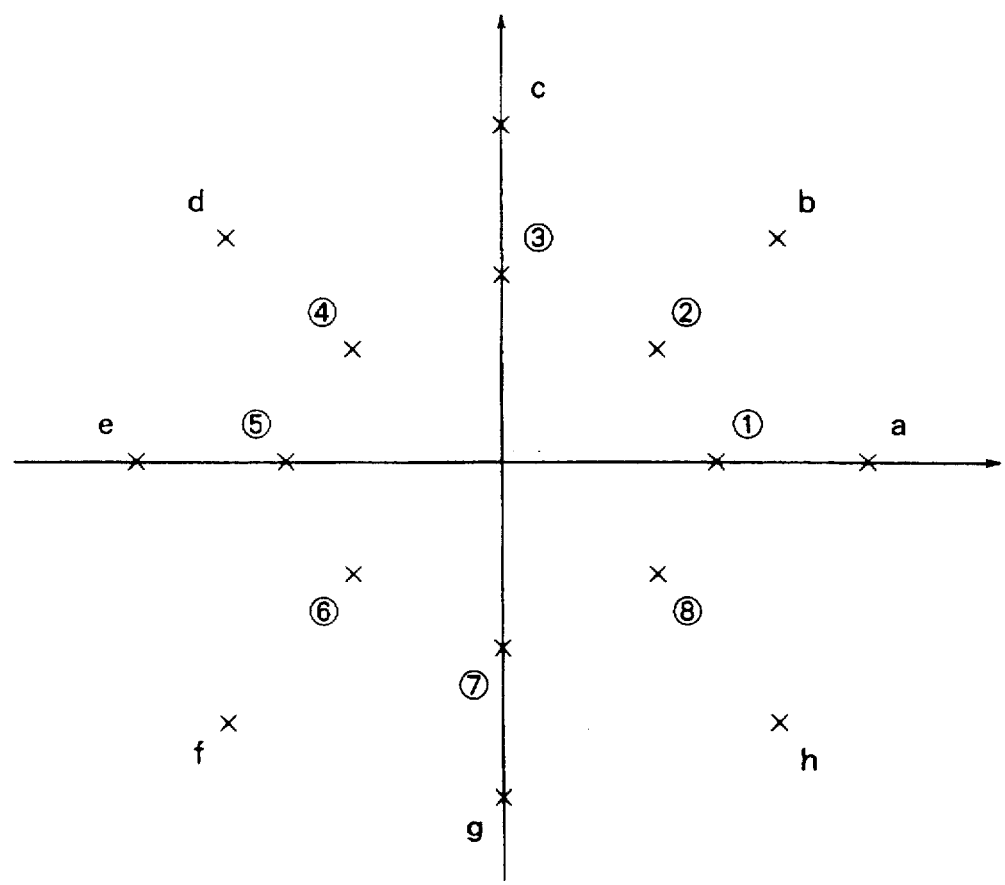
FIG. 44 is a schematic diagram showing a signal constellation of an amplitude and phase modulator according to a fourteenth embodiment of the present invention.

FIG. 44 is a schematic diagram for explaining a fourteenth embodiment of the present invention.

FIG. 44 shows the signal constellation of a π/4 shift QPSK modulator. The amplitude and phase modulator according to this embodiment is applied to the signal constellation shown in FIG. 44. FIG. 45 shows the relation of input and output of the phase converter 108. The signal reproducing device 110 pre-stores data that moves from the signal point (1) to the signal point (2) and data that moves from the signal point (1) to the signal point (4). A code sequence at each signal point in the counterclockwise direction is obtained from phase control signals P1 to P8. A code sequence at each signal point in the clockwise direction is obtained from phase control signals P9 to P16.

As described above, according to the amplitude and phase modulator of the present invention, since the storage capacity of the memory for use with the vector delta sigma modulator can be reduced. Thus, the vector delta sigma modulating circuit can be accomplished by an integrated circuit with a small chip area. In addition, the amplitude and phase modulator can be provided at low cost.

What is claimed is:

1. A modulator, comprising:
   vector code modulator means for converting input signals into selection signals according to said input signals, and
   selection means, responsive to said selection signals, for selecting and outputting one of a plurality of first signals, the selected first signal having the same frequency and different phase or amplitude as other ones of the plurality of first signals.

2. The modulator as set forth in claim 1,
   wherein said vector code modulator means is a delta sigma modulator.

3. The modulator as set forth in claim 1, wherein said vector code modulator means comprises:
   a linear transformer for inputting said input signals and a plurality of feedback signals as an input vector and for linearly transforming said input vector,
   an encoder for vector-quantizing the linearly transformed vector and for outputting an encoded output as selection signals, and
   a vector code decoder for decoding the encoded output into said plurality of feed-back signals.

4. The modulator as set forth in claim 3, wherein said vector code modulator means is adapted to output five types of signals, the five types of signals used for four signals and an other signal which are output from the selection means, and the four signals having the same amplitude and phases which differ by 90° from each other according to said plurality of input signals, the other signal having zero amplitude.

5. The modulator as set forth in claim 3, wherein said vector code modulator means is adapted to output three types of signals, the three types of signals used for outputting from the selection means, the three types of signals having the same amplitude and phases which differ by 120° from each other according to said plurality of input signals.

6. The modulator as set forth in claim 1, wherein said vector code modulator means comprises:

first signal conversion means for converting a first input signal into a first selection signal, and second signal conversion means for converting a second input signal into a second selection signal.

7. The modulator as set forth in claim 6, wherein each of said first signal conversion means and said second signal conversion means means is a delta sigma modulator.

8. The modulator as set forth in claim 6, wherein said selection means is adapted to select one of four types of signals with the same frequency and phases which differ by 90° each other according to said first and second selection signals.

9. The modulator as set forth in claim 6, further comprising;

a phase shifter for inputting a local oscillation signal and for outputting two types of signals with the same frequency and phases which differ by 90° each other, wherein said selection means is adapted to input said two types of signals, invert them, obtain four types of signals with the same frequency and phases which differ by 90° each other, and select one of the signals.

10. The modulator as set forth in claim 6, further comprising;

first inversion means for inverting said first selection signal, and second inversion means for inverting said second selection signal, wherein said selection means is adapted to output said first selection signal, the inverted signal thereof, said second selection signal, and the inverted signal thereof in a predetermined sequence.

11. The modulator as set forth in claim 6, wherein said selection means comprises;

a first phase switch for inputting a local oscillation signal and for switching between a first mode and a second mode, the first mode delaying said local oscillation signal by 0°, the second mode delaying said local oscillation signal by 180°, a second phase switch for inputting said local oscillation signal and for switching between a third mode and a fourth mode, the third mode delaying said local oscillation signal by 0°, the fourth mode delaying said local oscillation signal by 90°, and means for switching between said first mode and said second mode and between said third mode and fourth mode according to said first and second selection signals.

12. The modulator as set forth in claim 1, wherein said vector code modulator means comprises a signal generating means which generates a selecting signal sequence according to an input signal.

13. The modulator as set forth in claim 1, wherein said vector code modulator means comprises a signal generating means which generates a selecting signal sequence according to the input signal.

14. The modulator as set forth in claim 12, wherein said vector code modulator means comprises:

signal reproducing means for pre-storing a plurality of signal sequences that represent a first path on a phase plane, selecting one of the signal sequences corresponding to an input signal, and outputting the selected signal sequence; and phase converting means for converting the signal sequence that is output from said signal reproducing means into a signal sequence that represents a second path on the phase plane.

15. The modulator as set forth in claim 12, wherein said vector code modulator means comprises:

signal reproducing means for pre-storing a plurality of signal sequences that represent a first path on a phase plane, selecting one of the signal sequences corresponding to an input signal, and outputting the selected signal sequence;

phase control signal generating means for generating a phase control signal corresponding to the phase on the phase plane of the modulated signal sequence; and phase converting means for converting the signal sequence that is output from said signal reproducing means into a signal sequence that represents a second path on the phase plane corresponding to the phase control signal generated by said phase control signal generating means.

16. The modulator as set forth in claim 1, wherein the vector code modulator means converts the input signals into vector code signals as the selection signals.

17. A convertor which is used for an electric power controller, the convertor comprising;

vector code modulator means for converting an input signal into selection signals according to said input signal, said vector code modulator means comprising, a linear transformer for inputting input signals and feed-back signals as an input vector and for linearly transforming said input vector, an encoder for vector-quantizing the linearly transformed vector and for outputting an encoded output as selection signals, and a vector decoder for decoding the encoded output into said plurality of feed-back signals, and selection means, responsive to said selection signals, for selecting and outputting one of a plurality of first signals, the selected first signal having the same frequency and different phase or amplitude as other ones of the plurality of first signals.

18. The converter as set forth in claim 17, wherein the vector code modulator means converts the input signals into vector code signals as the selection signals.

19. A modulator, comprising:

a linear transformer for inputting modulation signals and feed-back signals as an input vector and for linearly transforming said input vector, an encoder for vector-quantization of said linearly transformed input vector and for outputting an encoded output as selection signals corresponding to different points on a phase plane, and a vector decoder for decoding said encoded output into said feed-back signals.

20. A modulation method, comprising the steps of;

converting input signals into selection signals according to said input signals using a vector code modulator, and selecting one of a plurality of first signals based on said selection signals, the selected first signal having the same frequency and different phase or amplitude as other ones of the plurality of first signals.

21. The method as set forth in claim 20, wherein the converting step includes converting the modulation signal into vector code signals as the selection signals.

22. A modulation method, comprising the steps of:
converting modulation signals into selection signals according to said modulation signals, by
inputting modulation signals and a plurality of feedback signals as an input vector and linearly transforming said input vector,
vector-quantizing said linearly transformed vector and outputting an encoded output as selection signals, and decoding said encoded output into said plurality of feedback signals; and selecting one of a plurality of first signals based on said selection signals, the selected first signal having the same frequency and different phase or amplitude as other ones of the plurality of first signals.

* * * * *

UNITED STATES PATENT AND TRADEMARK OFFICE
CERTIFICATE OF CORRECTION

PATENT NO. : 5,767,750

DATED : June 16, 1998

INVENTOR(S) : Takafumi YAMAJI

It is certified that error appears in the above-identified patent and that said Letters Patent is hereby corrected as shown below:

IN THE CLAIMS:

A transmitter which comprises at least a modulator and an amplifier;

wherein the modulator comprises:

vector code modulator means for converting input signals into selection signals according to said input signals, and selection means, responsive to said selection signals, for selecting and outputting one of a plurality of first signals, the selected first signal having the same frequency and different phase or amplitude as other ones of the plurality of first signals; and wherein the amplifier comprises means for amplifying the outputted first signals by the selection means.

The transmitter as set forth in claim 23, further comprising:

filter means for inputting the output signal by the modulator and for outputting a signal with a desired frequency.

UNITED STATES PATENT AND TRADEMARK OFFICE
CERTIFICATE OF CORRECTION

PATENT NO. : 5,767,750
DATED : June 16, 1998
INVENTOR(S) : Takafumi YAMAJI

It is certified that error appears in the above-identified patent and that said Letters Patent is hereby corrected as shown below:

The transmitter as set forth in claim 23, further comprising:

filter means for inputting the output signal by the amplifying means and for outputting a signal with a desired frequency.

Signed and Sealed this

Eighth Day of June, 1999

*Attest:*

Q. TODD DICKINSON

*Attesting Officer*     *Acting Commissioner of Patents and Trademarks*